United States Patent
Lehmann et al.

(10) Patent No.: US 6,661,721 B2
(45) Date of Patent: Dec. 9, 2003

(54) SYSTEMS AND METHODS FOR EXECUTING PRECHARGE COMMANDS USING POSTED PRECHARGE IN INTEGRATED CIRCUIT MEMORY DEVICES WITH MEMORY BANKS EACH INCLUDING LOCAL PRECHARGE CONTROL CIRCUITS

(75) Inventors: Gunther Lehmann, Poughkeepsie, NY (US); Thomas Boehler, Poughkeepsie, NY (US); Juei Lung Chen, Hopewell Junction, NY (US)

(73) Assignee: Infineon Technologies AG, Munich (DE)

( * ) Notice: Subject to any disclaimer, the term of this patent is extended or adjusted under 35 U.S.C. 154(b) by 15 days.

(21) Appl. No.: 10/017,106

(22) Filed: Dec. 13, 2001

(65) Prior Publication Data

US 2003/0112677 A1 Jun. 19, 2003

(51) Int. Cl.$^7$ .................................................. G11C 7/00
(52) U.S. Cl. ............. 365/203; 365/230.08; 365/230.03; 365/233
(58) Field of Search .................................. 365/203, 222, 365/233, 230.03, 230.08; 711/5, 105, 154, 167

(56) References Cited

U.S. PATENT DOCUMENTS

| | | | | |
|---|---|---|---|---|
| 6,052,331 A | * | 4/2000 | Araki et al. | 365/233 |
| 6,144,616 A | * | 11/2000 | Suzuki et al. | 365/233 |
| 6,185,149 B1 | * | 2/2001 | Fujioka et al. | 365/233 |
| 6,266,292 B1 | * | 7/2001 | Tsern et al. | 365/230.03 |

* cited by examiner

*Primary Examiner*—David Nelms
*Assistant Examiner*—Gene N. Auduong
(74) *Attorney, Agent, or Firm*—Jackson Walker L.L.P.

(57) ABSTRACT

A precharge command can be issued to a single bank or a precharge-all command can be issued to all banks of an integrated circuit memory device (e.g., DRAM circuit) at any time during normal operation of the device. Internal circuits are provided to decode the respective commands and send them to the different independent memory banks of the integrated circuit memory device. A local precharge control unit (or circuit) is present inside each of the memory banks that can receive and process the decoded precharge commands. If certain specified timing conditions are met, the local precharge control unit can issue and store a precharge request for a specific bank. The precharge request can be held back until all timing requirements are fulfilled. The precharge request can then be automatically executed.

26 Claims, 18 Drawing Sheets

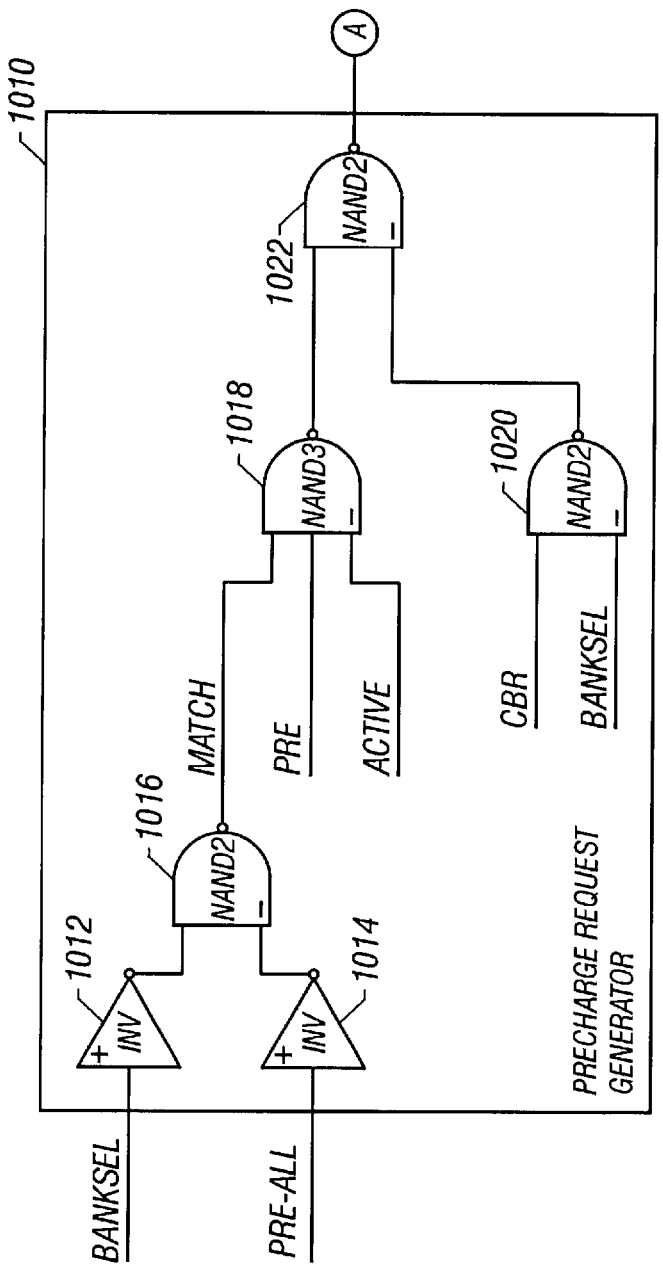

SYSTEMS AND METHODS FOR EXECUTING PRECHARGE COMMANDS USING POSTED PRECHARGE IN INTEGRATED CIRCUIT MEMORY DEVICES WITH MEMORY BANKS EACH INCLUDING LOCAL PRECHARGE CONTROL CIRCUITS

BACKGROUND OF THE INVENTION

The present invention relates to integrated circuit devices, and more particularly to integrated circuit memory devices and methods of operating integrated circuit memory devices.

Integrated circuit memory devices are widely used in consumer and commercial applications. One widely used integrated circuit memory device is, for example, synchronous Dynamic Random Access Memory devices (synchronous DRAM devices). Synchronous DRAMs may be used for the main memory of a computer system, and also may be used in graphics applications.

In a conventional DRAM device, a precharge command PRE turns off an active word line and restores a default voltage level on bit lines of the DRAM device. Before a word line is turned off, memory cells connected to that word line should have a valid voltage level. Valid voltage levels for interfaces of DRAM circuits are described, for example, in Intel Corporation's PC SDRAM Specification, Revision 1.7, November, 1999, hereinafter referred to as the PC-100 Specification.

To help ensure that memory cells connected to the word line have a valid voltage level, conventional DRAM devices are typically subject to timing constraints known as write back timing and write recovery. Write back timing constraints describe timing requirements after a word line activation. The write back timing requirements are generally analog and may be determined based on factors such as the physical characteristics of a memory cell, and sizing of a sense amplifier. Write recovery timing constraints describe timing requirements after a write command is sent to memory cells that are coupled to an already active word line. Write recovery timing requirements typically consist of a digital and an analog component. The digital component is based on write latency and burst length values. This delay can be expressed in terms of clock cycles and is therefore a function of the clock frequency. The analog component is based on physical delays resulting from input data latching to memory cells. The dominant portion of this analog write delay is typically the time that is needed to change the charge being stored inside the memory cells from the old to the new voltage level. This charging or discharging operation is similar to the charging or discharging of a capacitor through a resistor device. Therefore, this delay is independent of the clock frequency the DRAM device is operated at and hereby represents a delay that has a fixed value in real time (i.e., analog portion). Thus, conventional DRAM devices must comply with strict timing constraints when issuing a precharge command PRE. Unfortunately, those timing constraints can limit the usage of the command bus, for reasons some of which will be described below.

Referring now to FIG. 1A, external commands and addresses are input into the global DRAM control 101, which generates one of a precharge command and a precharge-all command along with appropriate bank addresses that are sent to a plurality of memory banks. Here, two memory banks, Bank A and B, are shown for purposes of simplicity, however, any number of memory banks could theoretically be employed in the same manner.

In conventional DRAM devices operating according to the PC-100 Specification, execution of either the precharge command or the precharge-all command is fixed with respect to a bank activation command ACT and a write command WRT, as will now be described below in conjunction with FIG. 1B. FIG. 1B shows a timing diagram of a precharge command PRE in a conventional DRAM device having a single bank configuration. In this example, it is presumed that a burst length BL is equal to four clock cycles, meaning that four data bits per data I/O are transferred from or to the DRAM device with each read or write command, respectively. As shown in FIG. 1B, a bank activation command ACT, which is also known as row address strobe (RAS) signal, is spaced apart from a precharge command PRE $t_{RAS}$ which here is by five clock cycles, the minimum write back timing requirement under the PC-100 Specification. Similarly, a write command WRT, which is also known as the column address strobe (CAS) signal with the write mode being activated, is also spaced apart from the precharge command PRE by five clock cycles, the minimum write recovery timing requirement under the PC-100 Specification. Thus, due to the timing requirements of the PC-100 Specification, a relatively large number of clock cycles can pass after the write command WRT or the bank activation command ACT before the precharge command is executed. Unfortunately, this fixed execution of the precharge command can limit the usage of a command bus since the command bus is shared between more than one bank.

Because the timing requirements can force fixed execution of the precharge command, conflicts on the command bus can result that may undesirably degrade system performance. As shown in FIG. 2, a potential conflict on the command bus of a conventional DRAM device can result. This example again assumes that a burst length BL is equal to 4. In this example, a memory controller that controls the DRAM device attempts to perform an external precharge command PRE on Bank A after a write command WRT has been executed. Due to this write recovery restriction of the PC-100 specification, a precharge command PRE is scheduled at a minimum of at least five clock cycles after the write command WVRT. Since a conflict might occur on the command bus, the write recovery restriction can preemptively restrict future usage of the command bus if the write command WRT at Bank B occurs simultaneously with the precharge command PRE at Bank A.

Fixed execution of the precharge-all command PRE-ALL with respect to the bank activation command ACT can also limit usage of banks that have been activated at an earlier time. As shown in FIG. 3, a precharge-all command PRE-ALL is executed to deactivate different word lines in banks that are currently open. However, under the PC-100 Specification, the timing requirements of a write back timing parameter $t_{RAS}$, require that the precharge-all command PRE-ALL be issued after at least five clock cycles have passed since the last bank activation command ACT. Thus, when bank activation commands ACT are issued in close proximity to different banks, for example Bank A and Bank B, this write back timing requirement can limit the usage of banks that have been activated earlier since clock cycles can be lost so that the precharge-all command PRE-ALL is executed simultaneously on all banks. In conventional DRAM circuits, the precharge-all command PRE-ALL can also undesirably cause a high peak power consumption since active word lines are shut off at the same time and bit line precharging circuits are turned on at the same time.

Furthermore, as shown in FIG. 4, conventional DRAM devices operating according to the PC-100 Specification allow for only one possible timing pattern that fulfills all timing requirements for minimum row cycle time (or random access time) $t_{RC}$. Accordingly, it may be desirable to provide improved integrated circuit devices that are more flexible in execution of precharge and/or precharge-all commands.

SUMMARY OF THE PREFERRED EMBODIMENTS

An aspect of the present invention can provide integrated circuit memory devices that include a memory array including at least one memory bank, and a pair of input/output lines coupled to the memory array, wherein each of the memory banks includes a local precharge control unit that can enhance system performance. The local precharge control unit can generate a precharge request that is then used in execution of a local precharge command to a specific memory bank.

According to another aspect of the invention, each of the local precharge control units may comprise, for example, means for generating a precharge request. The precharge request can then be used to execute a local precharge bank command without timing restrictions with respect to one of the external precharge command and the external precharge-all request, respectively. The means for generating generates a precharge request based on one of an external precharge command and an external precharge-all command.

According to another aspect of the invention, each of the local precharge control units may also comprise means for posting that is responsive to an indication that at least one specified timing requirement has been satisfied for at least that memory bank. The means for posting "posts" or delays execution of the precharge request, such that issuance of the local precharge bank command is delayed until the indication that at least one specified timing requirement has been satisfied for at least that memory bank is provided to the means for posting.

According to another aspect of the invention, the means for posting can also include means, responsive to the precharge request and to the indication that at least one specified timing requirement has been satisfied for at least that memory bank, for executing a local precharge bank command at any time without timing restrictions with respect to the precharge request when the means for executing receives the indication that specified timing requirements are satisfied for at least that memory bank.

The local precharge control unit can allow the local precharge bank request to be generated immediately after one of an external precharge command and an external precharge-all command is generated. As such, the local precharge bank request may be generated without timing restrictions with respect to other external commands. As such, the local precharge bank request can be generated at any time after a write command without a write back timing limitation and/or write recovery timing limitation with respect to one of the external precharge command and the external precharge-all command.

The local precharge control unit can also allow timing of one of the external precharge command and the external precharge-all command with respect to one of an external write command and an external bank activation command to not be subject to one of a write recovery timing limitation and a write back timing limitation, respectively. As such, spacing between one of the precharge command and the precharge-all command and a write command can be adjustable to provide variable spacing between the one of the precharge command and the precharge-all command and the write command. Moreover, spacing between one of the precharge command and the precharge-all command and a bank activation command can also be adjustable to provide variable spacing between a bank activation command and one of the precharge command and the precharge-all command. By contrast, spacing of the local precharge bank command may be fixed with respect to the bank activation command.

In comparison to conventional DRAM integrated circuit devices, aspects of the embodiments described-above can provide improved system performance. By removing timing restrictions that are normally present during execution of one of the external precharge command and the external precharge-all command, more flexible utilization of the command bus can be provided. Moreover, data bus utilization can also improved since more opportunities to issue read or write commands for the data bus are generated. Finally, the number of power consumption peaks can also be reduced. These improvements with respect to command bus and data bus utilization can lead to overall improvements in system performance.

An aspect of the present invention may also include methods of operating an integrated circuit memory device in which local precharge bank commands are generated in the memory device. In particular, a precharge request can be generated that is used to execute a local precharge bank command. The precharge request can be posted responsive to one of an external precharge command and an external precharge all command. Posting may comprise holding the precharge request until the indication is provided that the at least one specified timing requirement has been satisfied for at least that memory bank indicating that specified timing requirements are fulfilled. Alternatively, posting may comprise sampling and storing the precharge request, and holding execution of the stored precharge request until the holding means receives the indication. In either case, execution of the local precharge bank command can be delayed until the indication is provided that the at least one specified timing requirement has been satisfied, for at least that memory bank. The local precharge bank command can then be executed responsive to the precharge request and to the indication that the at least one specified timing requirement has been satisfied for at least that memory bank.

BRIEF DESCRIPTION OF THE DRAWINGS

FIGS. 10A and 10B are block schematic diagrams of a local precharge control unit according to other embodiments.

DETAILED DESCRIPTION OF THE PREFERRED EMBODIMENTS

Figure 1A:
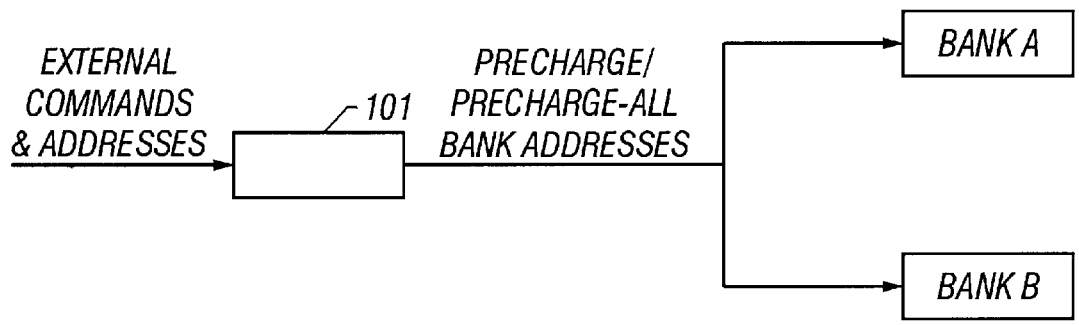
FIG. 1A is a block diagram of a portion of a conventional integrated circuit memory device.
Figure 1B:
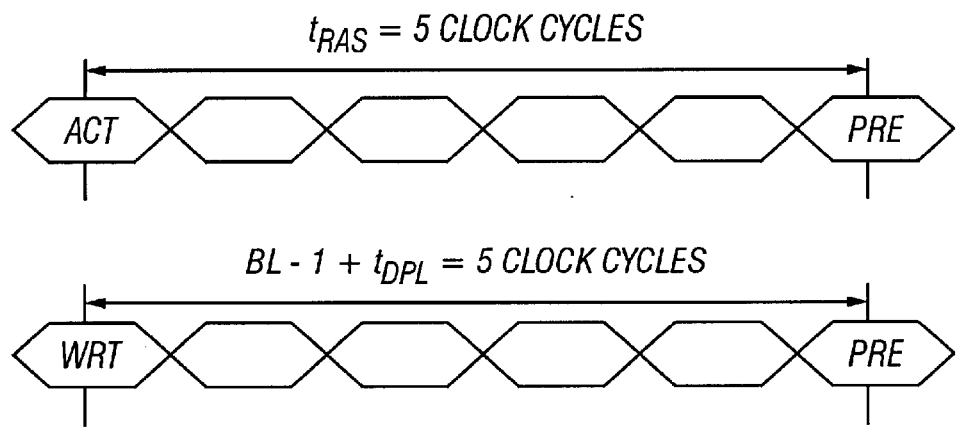
FIG. 1B is a timing diagram which illustrates precharge command timing requirements for operation of a memory device according to a PC-100 Specification.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. It is also noted that like reference numerals may be used to designate identical or corresponding parts throughout the drawings. As used herein, the term "local" refers to each independent memory bank inside an integrated circuit memory device, whereas the term "global" refers to the overall integrated circuit memory device. It will also be understood that when an element such as a block, circuit, circuit component and/or device is referred to as being "connected to" another element, it can be directly connected to the other element or intervening elements may also be present. In contrast, when an element is referred to as being "directly connected to" another element, there are no intervening elements present. When an element such as a block, circuit, circuit component and/or device is referred to as being "adjacent" another element, it can be near the other element but not necessarily independent of the other element. When an element such as a block, circuit, circuit component and/or device is referred to as being "between" two things, it can be either partly of completely between those two things, but is not necessarily completely and continuously between those two things. The term "adapted to" should be construed to mean "capable of".

Throughout the description, the terms precharge, pre bank, precharge bank, precharge bank signal, precharge bank command, local precharge command, and local precharge bank command can be used interchangeably.

The description below assumes that the local precharge control unit is implemented in a DRAM integrated circuit memory device; however, the embodiments might also function in other types of integrated circuit memory devices. Thus, the aspects of the present invention described herein do not have any dependency on DRAM integrated circuit devices. Moreover, while certain aspects of the present invention are described in the context of an integrated circuit memory device including two memory banks, it will be appreciated that those aspects of the invention are independent of and equally applicable to any number of memory banks. For instance, aspects of the invention are not restricted to two banks and can be adapted for use in a single bank DRAM circuit. Moreover, an integrated circuit using a multiple single bank DRAM would benefit from increased command bus flexibility, and the proposed posted precharge can easily be extended to more than two banks by simply adding banks and the corresponding local precharge control unit.

Embodiments are related to integrated circuit memory devices that include at least one memory bank. Each memory bank includes a local precharge control unit therein. The local precharge control unit can utilize a precharge request to improve system performance by removing complex timing restrictions related to the execution of one of a precharge command and a precharge-all command.

Removing timing restrictions can add flexibility to usage of the command bus that can provide higher command bus utilization. The added flexibility on the command bus can also contribute to better data bus utilization by generating more opportunities to issue read or write commands for the data bus. Both improvements in command bus and data bus utilization can lead to a higher overall system performance and a reduced number of power consumption peaks. Techniques are provided for avoiding conflicts on the command bus by delaying execution of one of the precharge command and the precharge-all command.

Figure 5A:
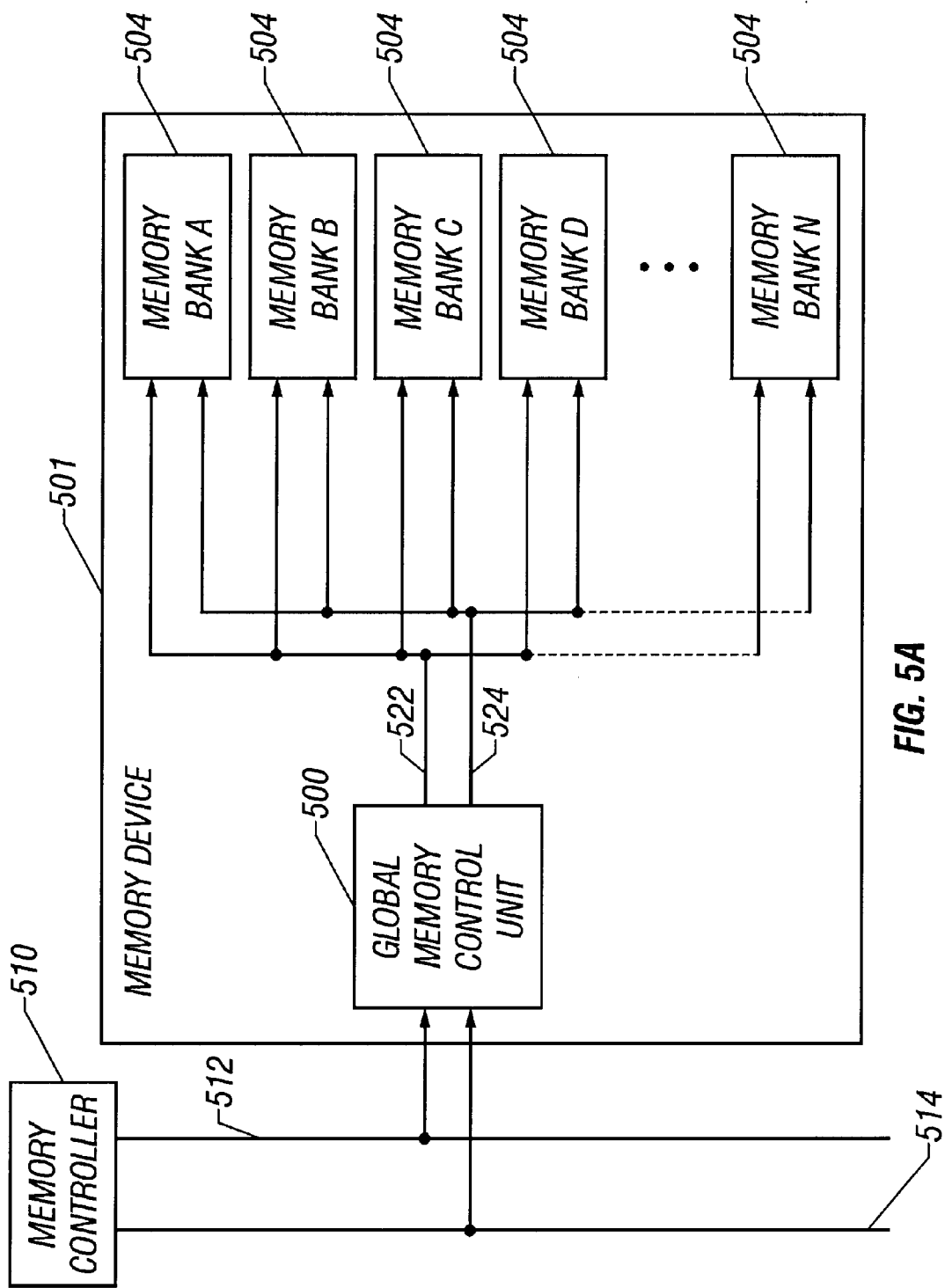
FIGS. 5A and 5B are block diagrams of an integrated circuit memory device.
Figure 5B:
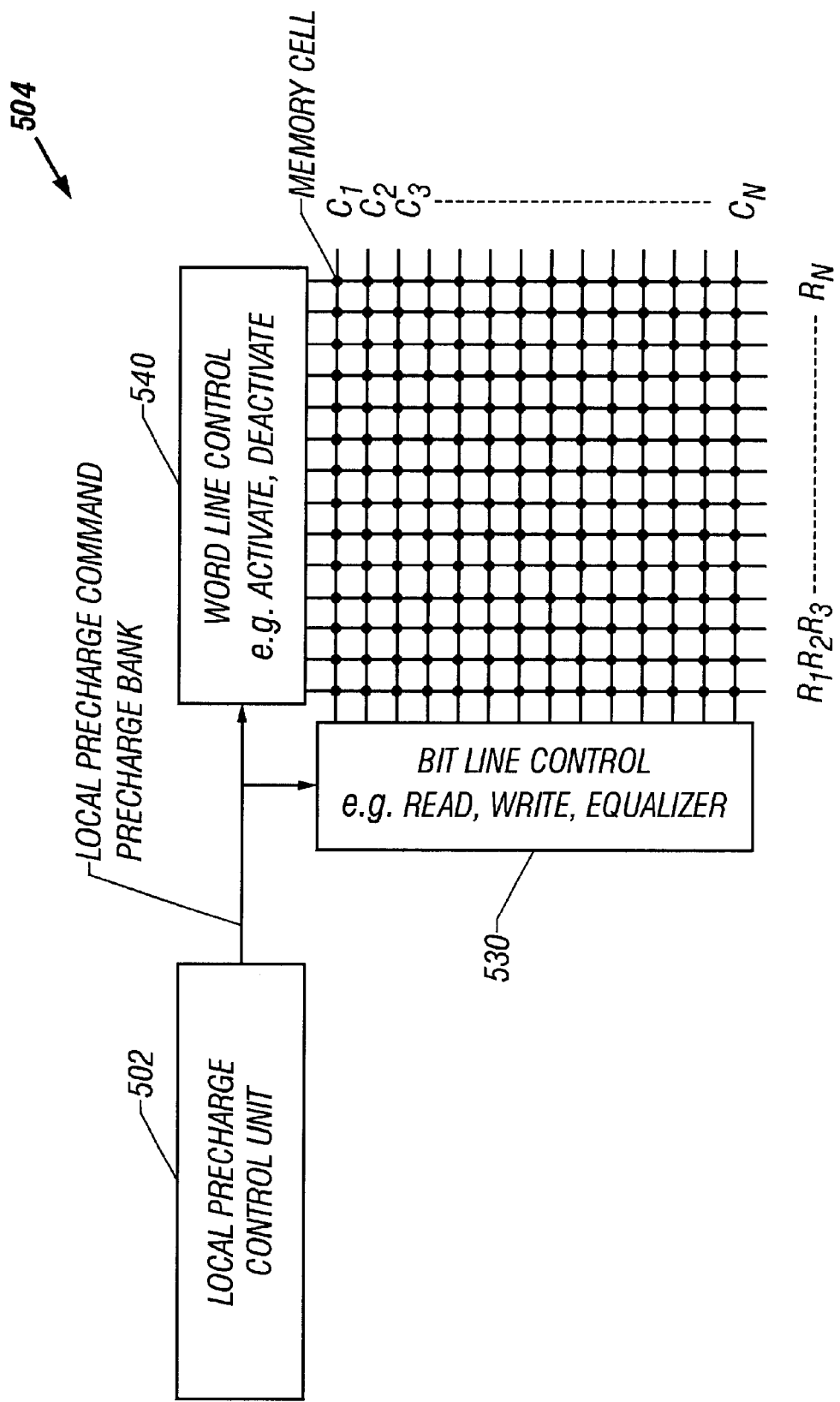

Referring now to FIGS. 5A and 5B, shown is a block diagram of a portion of an integrated circuit memory device. The integrated circuit memory device 501 includes, among other units, a memory controller 510, a global memory control unit 500, and a plurality of memory banks 504 (labeled as Memory Bank A . . . Memory Bank N). The memory controller 510 generates, among other signals, commands that are sent to global memory control unit 500 within one or more memory devices 501 via an external command bus 512 and addresses that are sent to the global memory unit 500 via the external address bus 514. The global memory control unit 500 inside the memory device 501 decodes the signals on the external command bus 512 and generates, among other signals, external precharge or precharge-all commands that can be sent to a plurality of memory banks 504. The global memory control unit 500 also decodes signals on the external address bus 514 and generates, among other signals, bank addresses, row addresses, column addresses that can also be sent to the plurality of memory banks 504.

As shown in FIG. 5B, each of the memory banks 504 include a local precharge control unit 502. FIG. 5B illustrates memory banks 504, such as BANK A, having word lines or rows ($R_1 \ldots R_N$) and bit lines or columns ($C_1 \ldots C_N$) of memory cells, and their relationship to the local precharge control unit 502. More specifically, the local precharge control unit 502 can generate a local precharge command PRECHARGE BANK that is sent to a bit line control 530 and a word line control 540. The bit line control 530 controls, for example, read, write and equalize operations to the columns $C_1 \ldots C_N$ of memory cells, whereas the word line control 540 controls, for example, activate and deactivate operations to each of the rows $R_1 \ldots R_N$ of memory cells.

Figure 6:
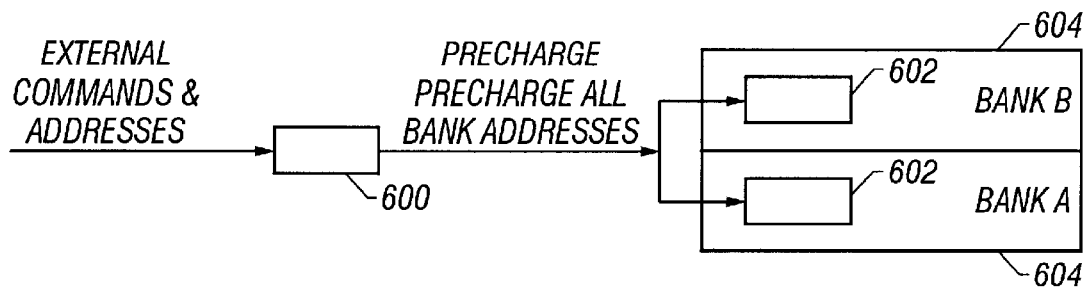
FIG. 6 is a block diagram of a portion of an integrated circuit memory device including local precharge control units according to embodiments of the present invention.

Referring now to FIG. 6, shown is a block diagram of a portion of an integrated circuit memory device including local precharge control units according to aspects of the present invention. As shown in FIG. 6, a global memory control unit 600 generates at least one of an external precharge command, an external precharge-all command, and at least one bank address, in response to external commands and addresses input to the global memory control unit 600. At least one of the external precharge command, the external precharge-all command, and the at least one bank address, are then input into a local precharge control unit in each of the memory banks included in the integrated circuit memory device. In the example shown in FIG. 6, two memory banks, Bank A 604 and Bank B 604 are included in the integrated circuit memory device. Each of the memory banks 604 includes a local precharge control unit 602. The integrated circuit memory device (shown in FIG. 6) has two independent memory banks A and B.

It will be appreciated that aspects of the present invention are not restricted to two banks since embodiments of the present invention would be equally applicable to applications implementing a single memory bank or a plurality of memory banks. An application using multiple single bank DRAMs could also benefit from the increased command bus flexibility. The integrated circuit memory device shown in FIG. 6 could easily be extended to more than two banks by simply adding banks having the corresponding local precharge control unit 602. External commands and addresses are decoded in a so-called global control or command decoder 600. The decoded commands and addresses such as read commands or activate commands, can then be propagated to appropriate memory banks of the IC memory device. A local precharge control circuit inside each of the banks will now be described below with regard to FIG. 7.

Figure 7:
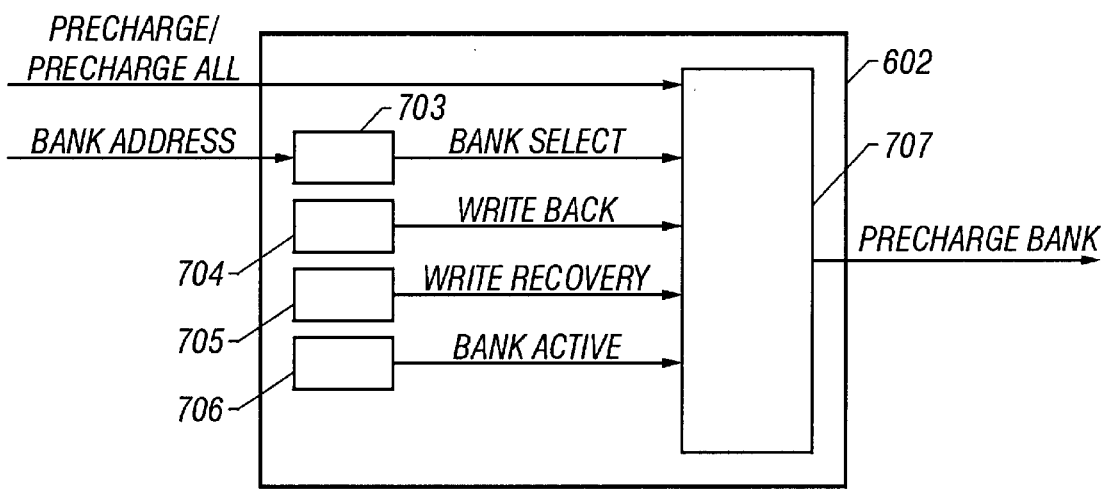
FIG. 7 is a block diagram of a local precharge control unit according to embodiments of the present invention.

Referring now to FIG. 7, shown is a block diagram of one example of a local precharge control unit according to implementations of the present invention. Each local precharge control unit 602 may include, for example, a bank decoder 703, a write back timer circuit 704, a write recovery timer circuit 705, and a bank status register 706 and a controller 707 which is also known as a precharge request block. The precharge request block 707 receives one of the external precharge commands and the external precharge-all command, at least one bank select signal from the bank decoder 703, a write back signal from the write back timer 704, a write recovery signal from the write recovery timer 705, and/or a bank activation signal from the bank status register 706. The bank decoder 703 is responsive to at least one bank address, and generates the bank select signal in response thereto.

In particular, the bank decoder 703 is adapted to detect whether a specific memory bank has been selected by the external bank address. The write back timer circuit 704 is adapted to generate a signal indicative of whether sufficient time from the last bank activate command has passed (write back timing). The write recovery timer circuit 705 is adapted to generate a signal indicative of whether sufficient time from the last CAS command, for example, read command or write command, has passed (write recovery timing). The bank status register 706 is adapted to indicate if a respective bank is active or precharged.

Based on the signals above, a controller 707 can evaluate the above-described conditions. If the conditions for a valid precharge request are met, circuit 707 stores a precharge request. Controller 707 can generate a local precharge bank command if the precharge request is present and the timing conditions described above are fulfilled. After sending out a local precharge bank command, the controller 707 resets the precharge request since the precharge request has been processed.

When the precharge request block 707 receives the external precharge command, the precharge request block 707 generates a local precharge bank command in response to the bank select signal, the bank activation signal, the write back signal, and the write recover signal. When the precharge request block 707 receives the external precharge-all command, the precharge request block 707 generates a local precharge bank command in response to the bank activation signal, the write back signal, and the write recover signal.

Figure 8:
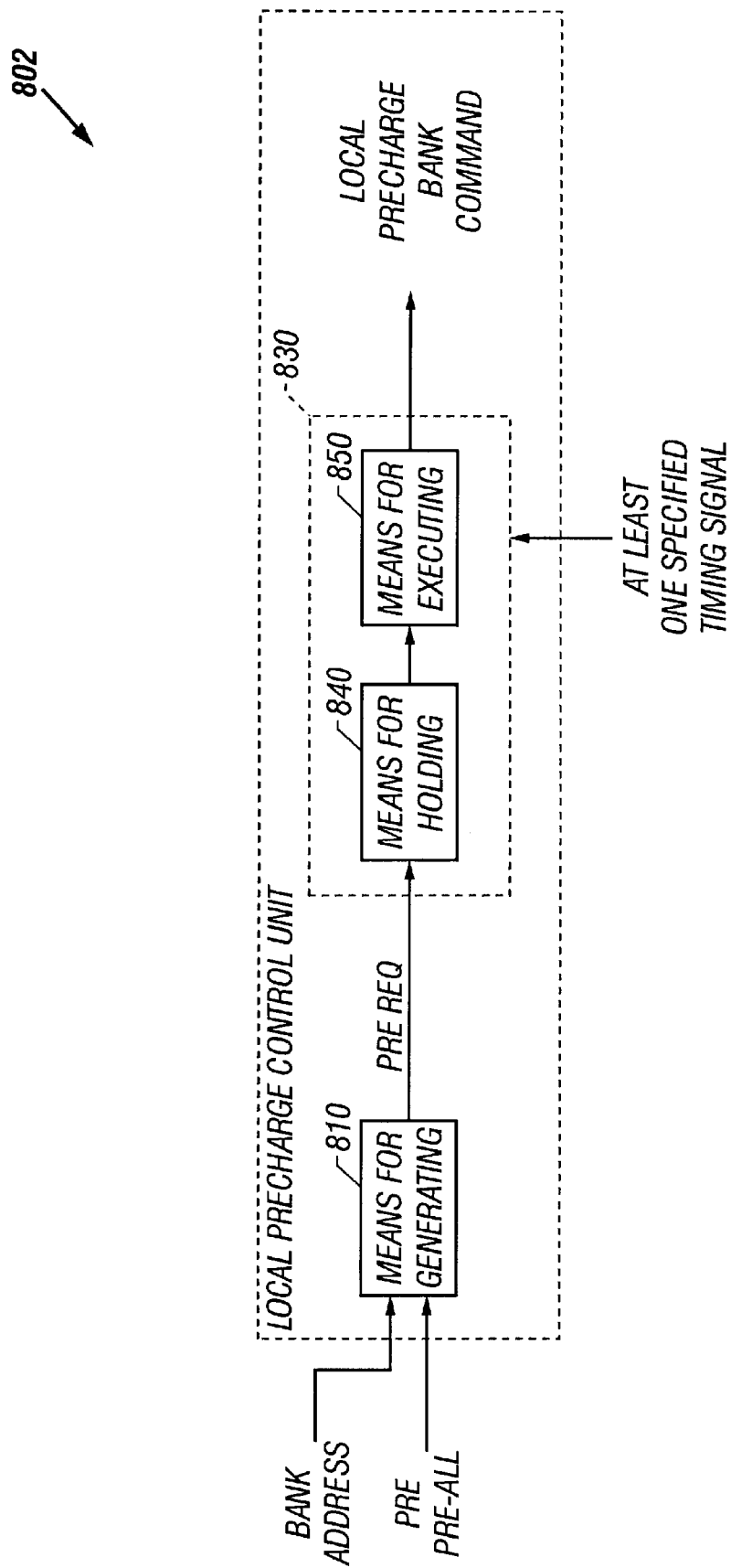
FIG. 8 is a block diagram of a local precharge control unit according to other embodiments of the present invention.

Referring now to FIG. 8, shown is a block diagram of a local precharge control according to other implementations of the present invention. As shown in FIG. 8, each of the local precharge control units 802 may comprise, for example, means for generating 810 a precharge request PRE REQ. The means for generating 810 generates a precharge request PRE REQ based on one of an external precharge command PRE, an external precharge-all command PRE ALL and at least one bank address in the case of an external precharge command PRE. The precharge request PRE REQ can then be used to execute a local precharge bank command PRE BANK, without timing restrictions with respect to the precharge request PRE REQ.

As shown in FIG. 8, each of the local precharge control units 802 may also comprise means for posting 830 that is responsive to an indication that at least one specified timing requirement has been satisfied for at least that memory bank. In particular, the means for posting 830 "posts" the precharge request PRE REQ, such that execution of the local precharge bank command PRE BANK is delayed until the indication that the at least one specified timing requirement has been satisfied for at least that memory bank is provided to the means for posting 840.

This indication can comprise, for example, at least one of a local write back timing requirement and a local write recovery timing requirement. The local write back timing requirement may indicate that a first specified time has elapsed after a prior bank activation command to allow satisfactory write back to that memory bank. On the other hand, the local write recovery timing requirement may indicate that a second specified time has elapsed after a prior write command to allow satisfactory write recovery to that memory bank. The first and second specified times can be the same but are usually different.

Still referring to FIG. 8, the means for posting 830 can comprise, for example, means for holding 840 and means for executing 850. The means for holding can sample and store the precharge request PRE REQ until the indication that the at least one specified timing requirement has been satisfied is provided.

Execution of a local precharge bank command PRE BANK is delayed until the indication is provided. After sampling one of an external precharge command PRE and an external precharge-all command PRE ALL, a first means can determine which one of the external precharge command PRE and the external precharge-all command PRE ALL is present. A second means can determine whether the memory bank is active. When the first means determines that the external precharge command PRE is present and the second means determines that the memory bank is active and that the memory bank is selected by an external bank address, the external precharge command PRE is stored in the memory bank as the local precharge request PRE REQ. In addition, when the first means determines that the external precharge-all command PRE ALL is present and the second means determines that the memory bank is active, the external precharge-all PRE-ALL command is stored in the memory banks as the local precharge request PRE REQ.

As shown in FIG. 8, the means for posting 830 can also include means for executing. The means for executing is responsive to the precharge request PRE REQ and to the indication that the at least one specified timing requirement has been satisfied for at least that memory bank. The means for executing 850 can execute a local precharge bank command PRE BANK at any time, without timing restrictions, with respect to the precharge request PRE REQ. This happens when the means for executing 850 receives an indication that the at least one specified timing requirement has been satisfied for at least that memory bank. As described above, the means for executing 850 may be responsive to the precharge request PRE REQ and to, for example, the write back timing requirement and the write recovery timing requirement.

When the precharge request PRE REQ is generated during a first clock cycle, the means for executing 850 can execute the precharge request PRE REQ during any clock cycle subsequent to the first clock cycle including the first clock cycle itself without timing restrictions with respect to the precharge request PRE REQ, to generate a local precharge bank command PRE BANK.

Figure 9:
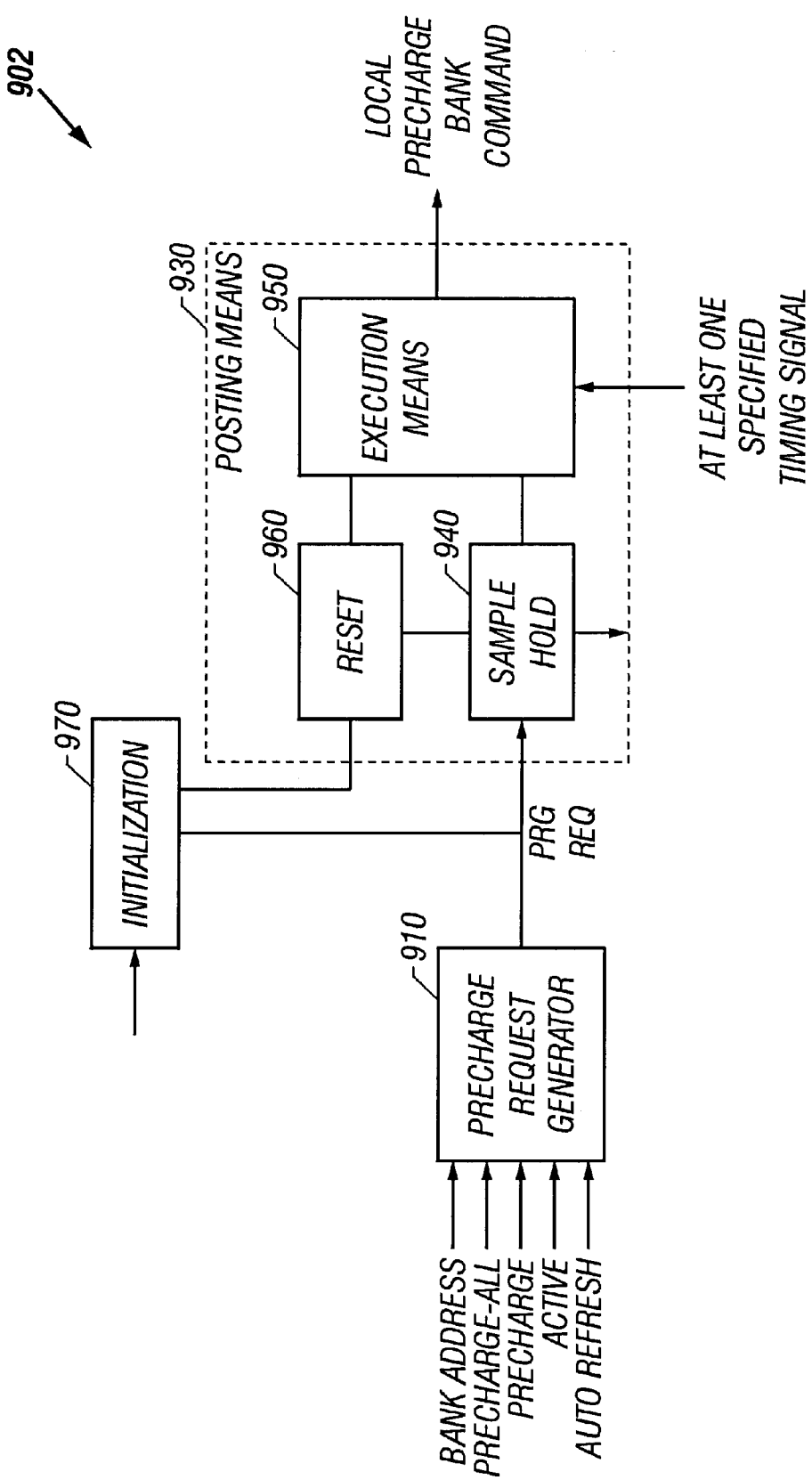
FIG. 9 is a block schematic diagram of a local precharge control unit according to other embodiments of the present invention.

Referring now to FIG. 9, shown is a block schematic diagram illustrating additional local precharge control units 902 according to other implementations of the present invention. As shown in FIG. 9, the local precharge control unit 902 includes a precharge request generator 910, an initialization unit 970, and posting means 930. The posting means 930 can include, for example, a sample hold circuit 940, an execution means 950, and a reset circuit 960.

The precharge request generator 910 receives a plurality of input signals including one of an external precharge command, an external precharge-all command, at least one external bank address signal, a bank currently active (active word line) signal, and an external auto refresh command decoded signal. In response to these input signals, the precharge request generator generates a precharge request, that is input into the sample hold unit 940.

The sample hold circuit 940 can sample the precharge request, and holds the request for subsequent execution. The precharge request can be eventually sent to the execution means 950. The execution means 950 is responsive to at least one specified timing signal. The precharge request can be executed by the execution means, for example, once the at least one specified timing signal is input into the execution means. As a result, a precharge command (shown here as PRE BANK) will be generated. Upon execution, the execution means also inputs a signal into the reset circuit 960 which in turn outputs a signal to reset the sample hold circuit 940. The sample hold circuit 940 is then ready to accept the new precharge request once a particular bank is activated again by an input signal bank active ACTIVE that is input into the precharge request generator 910. The initialization block 970 can allow proper initialization after a reset signal is input into the initialization block when the control unit 902 is powered on.

Figure 10B:
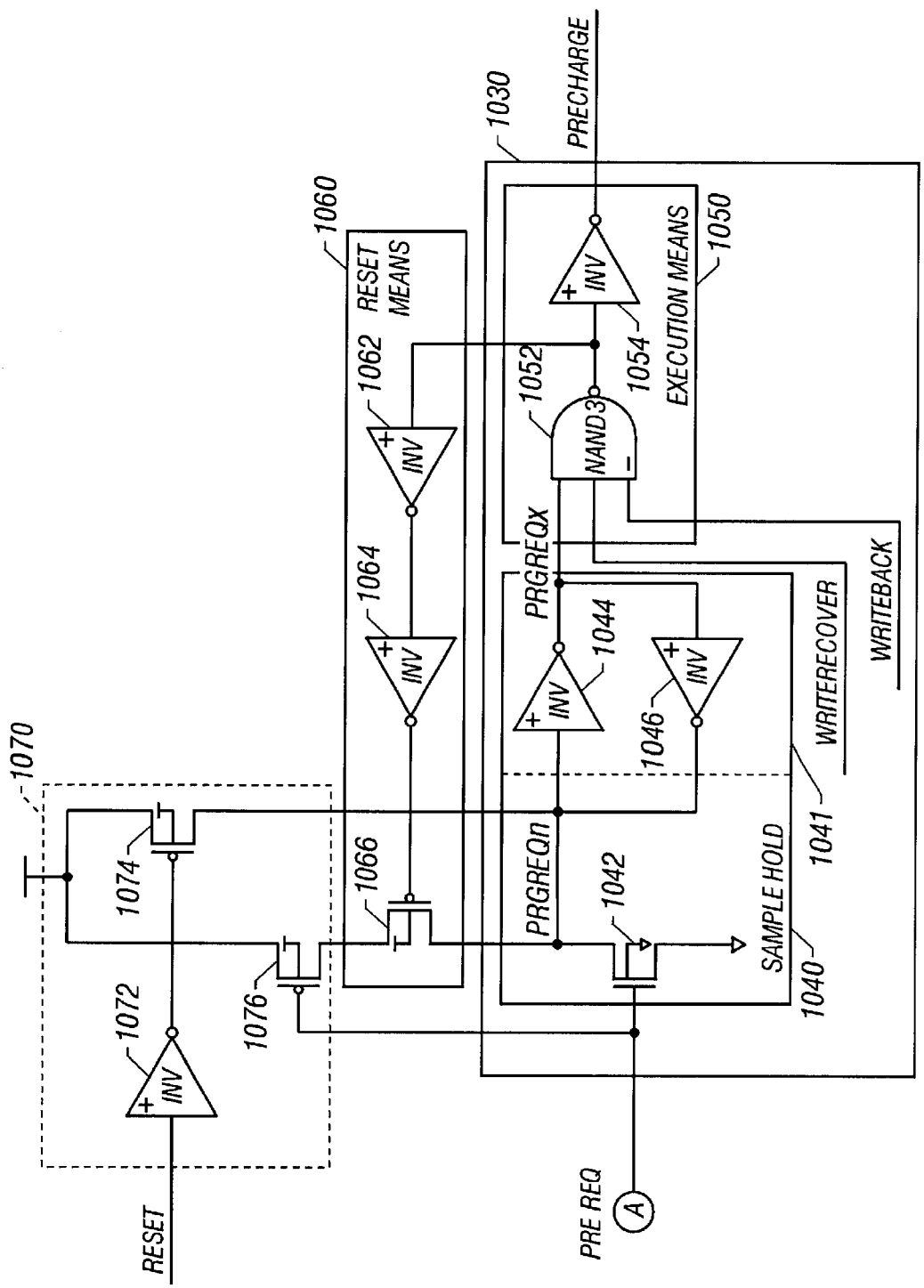

Referring now to FIGS. 10A and 10B, shown is an electrical schematic illustrating an example of an additional local precharge control unit 1002 implemented with CMOS technology. It should be appreciated, however, that aspects of the present invention could be implemented using other types of fabrication, such as NMOS or Bipolor technology, and therefore aspects of the present invention should not be construed as being limited to CMOS technology. Moreover, embodiments of the present invention would be equally applicable to complimentary conductivity type designs.

As shown in FIGS. 10A and 10B, the local precharge control unit 1002 includes means for generating 1010 the precharge request PRE REQ, a posting means 1030, a reset means 1060, and an initialization circuit 1070. The posting means 1030 may include a sample/hold means 1040 and an execution means 1050. The means for generating 1010 is responsive to at least one of an active bank address signal (or active word line signal) ACTIVE, an external precharge-all command PRE-ALL, an external precharge command PRE, an external bank address signal BANKSEL, and an external auto refresh command CBR. The means for generating also serves as a means for detecting validity of one of the external precharge command PRE and the external precharge-all command PRE-ALL, and for generating he precharge request PRE REQ if one of a valid external precharge command or a valid external precharge-all command is detected.

As shown in FIG. 10A, the means for generating 1010 can comprise a first NAND gate 1016 having a first input responsive to an inverted 1012 external bank address BANKSEL, and a second input responsive to an inverted 1014 external precharge-all command PRE-ALL or as is; a second NAND gate 1018 having a first input responsive to the output MATCH of the first NAND gate 1016, a second input responsive to an external precharge command PRE, and a third input responsive to an active word line (bank address) signal ACTIVE or as is; a third NAND gate 1020 having a first input responsive to a decoded external auto refresh command CBR and a second input responsive to an external bank address BANKSEL; and a fourth NAND gate 1022 having a first input responsive to an output of the second NAND gate 1018, and a second input responsive to an output of the third NAND gate 1020. The first NAND gate 1016, third NAND gate 1020, and fourth NAND gate 1022 can be fabricated identically, while the second NAND gate 1018 can be fabricated separately from the other NAND gates.

Thus, the means for generating 1010 can output the precharge request PRE REQ if the means for generating 1010 determines that the external precharge command PRE and the external precharge-all command PRE-ALL is valid.

The precharge request PRE REQ output by the means for generating or "detecting validity" is then input as shown in FIG. 10B into the sample/hold means 1040 of the posting means 1030.

The external precharge command PRE will be valid for a specific bank and will result in the generation of a precharge request PRE REQ for a specific bank if the bank is active, the externally supplied bank address selects the specific bank, and a precharge command PRE is present. By contrast, the external precharge-all command PRE-ALL will be valid for all banks and will result in the generation of a precharge request PRE REQ if the bank is active, and the precharge-all command PRE-ALL is present. The memory bank is active when a word line is active. By restricting validity to active banks, latching unnecessary precharge requests to banks that are already precharged can be prevented. Furthermore, a precharge request PRE REQ will be generated if the externally or internally generated bank address selects the specific bank and if the refresh command CBR is valid.

The sample/hold means 1040 stores the precharge request PRE REQ. In one embodiment, the sample/hold means 1040 may comprise, for example, an NMOS transistor 1042 coupled to the output of the means for detecting validity 1010, and a means for storing 1041. The NMOS transistor 1042 can be turned on in response to a high signal that is output when a valid precharge request PRE-REQ is output from the means for detecting validity 1010. This will cause the means for storing 1041 to store the precharge request PRE REQ for further execution.

The means for storing 1041 may comprise, for example, a latch circuit 1041 having an input responsive to an output from the NMOS transistor 1042 that causes the latch circuit 1041 to flip to store the precharge request PRE REQ for further execution. For example, the latch circuit 1041 may be an inverting latch that comprises first 1044 and second cross-coupled inverters 1046. The first cross-coupled inverter 1044 can have an input responsive to the inverted precharge request PRE REQn. The second cross-coupled inverter 1046 can have an input responsive to the output of the first cross-coupled inverter 1044, wherein an output of the second cross-coupled inverter 1046 is fed back to the input of the first cross-coupled inverter 1044.

As shown in FIG. 10B, the means for executing 1050 may comprise a three-input NAND gate 1052 having a first input responsive to the output of the storing means 1041, a second input responsive to a first indication that the at least one specified timing requirement has been satisfied for at least that memory bank, and a third input responsive to a second specified indication that the at least one specified timing requirement has been satisfied for at least one memory bank.

The first indication that the at least one specified timing requirement has been satisfied for at least that memory bank may comprise, for example, a write recovery signal WRITERECOVER, and the second indication that the at least one specified timing requirement has been satisfied for at least that memory bank may comprise, for example, a write back signal WRITEBACK. Execution of the precharge request PRE REQ is held back by the two timer signals WRITERECOVER and WRITEBACK which ensure that the respective timing requirements are satisfied for designated memory bank(s). If both of them are high and the output of the storing means 1041 is high, the PRECHARGE signal goes high and initiates the execution of the precharge request PRE REQ on the appropriate bank(s). The request may be executed without delay if the specified timing requirements are met when the precharge request PRE REQ is generated.

Thus, the means for executing 1050 is adapted to execute the local precharge bank command PRE BANK at any clock cycle subsequent to the precharge request PRE REQ when the write recovery signal WRITERECOVER and the write back signal WRITEBACK are input into the means for executing 1050. In other words, a locally stored precharge request PRE REQ is automatically executed if the request is existent, a timer circuit indicates that sufficient time has passed after a prior bank activation command ACT (e.g., the last RAS command) to allow for sufficient write back, and another timer circuit indicates that sufficient time has passed after a prior write command WRT (e.g., the last CAS command) to allow for sufficient write recovery.

As shown in FIG. 10B, the local precharge control unit 1002 may also include a reset circuit 1060 for resetting the precharge request PRE REQ. After initiating the execution of the precharge request PRE REQ, the precharge request is erased through a reset circuit 1060. The reset circuit 1060 has, for example, an input that includes a first inverter 1062 coupled in series to a second inverter 1064. The input is responsive to a feed back output of the means for posting 1030. The output of the inverter, 1064 is coupled to a gate electrode of a first PMOS transistor 1066 that is electrically coupled in series between a second PMOS transistor 1076 and the NMOS transistor 1042. This provides a pulsed PRECHARGE signal, and resets the latch 1041 of the local precharge control unit 1002, so that the unit is ready to accept a new precharge request PRE REQ after the bank has been activated again by a bank active signal ACTIVE.

As shown in FIG. 10B, the local precharge control unit 1002 may also include an initialization circuit 1070 responsive to a reset signal RESET to insure proper initialization after power-on. The initialization circuit 1070 may comprise an inverter 1072 coupled to a gate electrode of a third PMOS transistor 1074. A source of the third PMOS transistor 1074 is coupled to a source electrode of the second PMOS transistor 1076. A drain of the third PMOS transistor 1074 is coupled to the drain of the NMOS transistor 1042.

In comparison to conventional DRAM integrated circuit devices, the embodiments described-above can provide improved system performance. By removing timing restrictions that are normally present during execution of one of the precharge command and the precharge-all command, more flexible utilization of the command bus can allow improved command bus utilization. Moreover, data bus utilization is also improved since there are more opportunities generated to issue read or write commands for the data bus. Finally, the number of power consumption peaks can also be reduced since a precharge all command being sent to a plurality of active memory banks does not necessarily cause the simultaneous execution of the precharge operation in all active banks. In other words, as will be shown in exemplary FIG. 12B, each active bank can time the execution of the precharge command independently from the other active banks thus enabling the possibility of precharge operations being executed at different times even though all of the precharge operations were initiated by the same external precharge all command. These improvements with respect to command bus and data bus utilization can lead to overall improvements in system performance. Some of the reasons for this improved performance will now be explained with reference to FIGS. 11 through 13 which illustrate some of these benefits.

Figure 4:
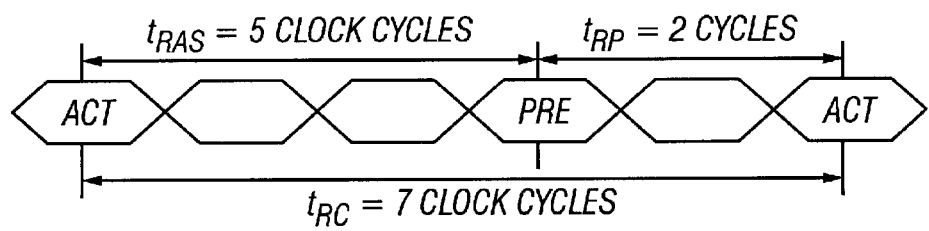
FIG. 4 is a timing diagram which illustrates the command sequence timing requirement for minimum row cycle time or random access time during operation of a memory device according to the PC-100 Specification.
Figure 11:
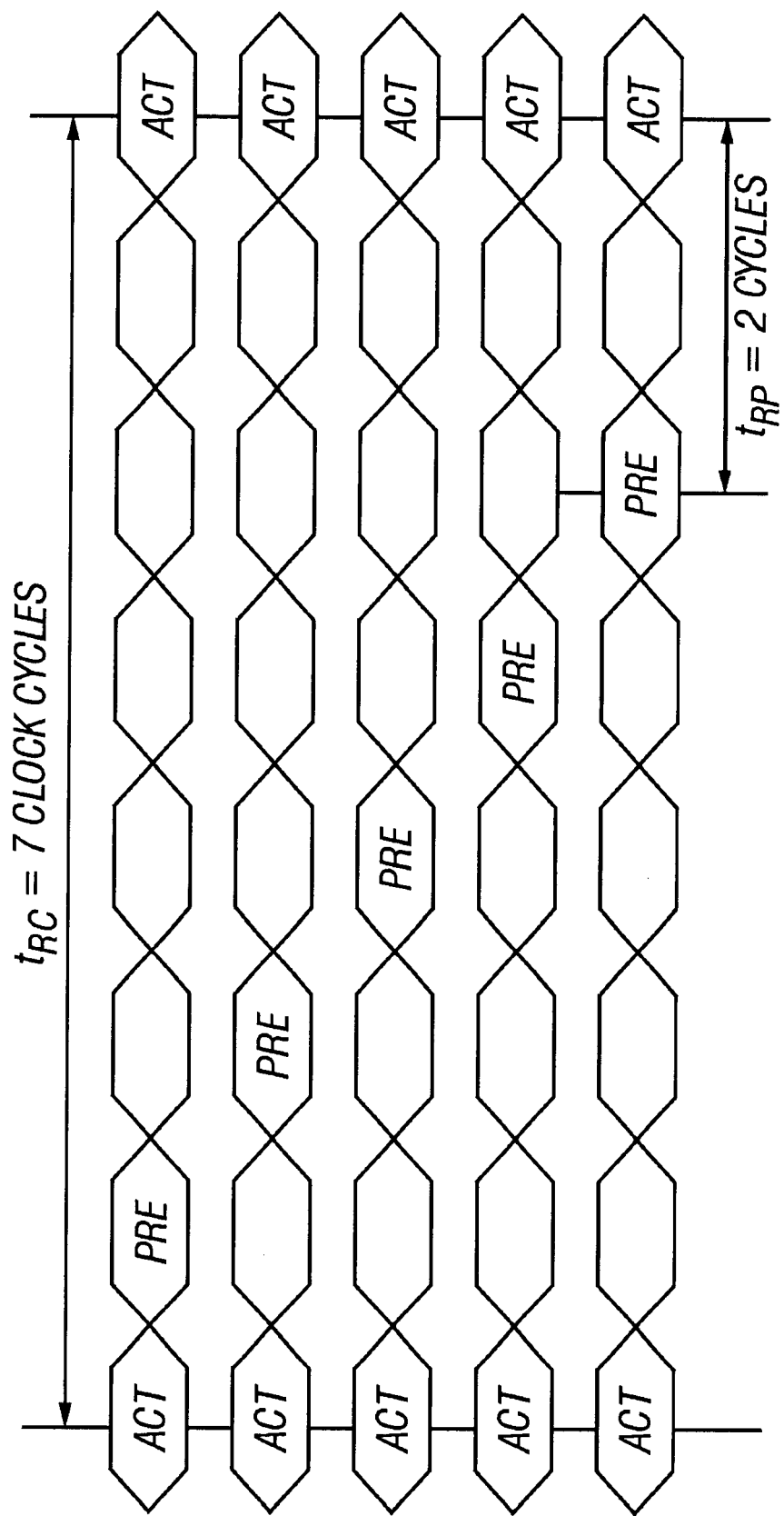
FIG. 11 is a timing diagram that illustrates precharge command timing requirements for operation of a memory device according to embodiments of the present invention.

Referring now to FIG. 11, shown is a timing diagram that illustrates operation of embodiments of integrated circuit memory devices described above during a precharge command. As discussed above and as shown in FIG. 4, according to the conventional precharge methods, such as those specified by the PC-100 Specification, there is only one possible command sequence (or timing pattern) that fulfills all of the timing requirements to provide minimum row cycle time $t_{RC}$.

By contrast, as shown in FIG. 11, posting the precharge request PRE REQ allows one of a precharge bank command (i.e., local precharge bank command) and a precharge-all command bank to be validly issued at any of five different clock cycles between successive bank activation commands ACT. In other words, there are five possible command sequences (or timing patterns) that fulfill all of the timing requirements to provide the minimum row cycle time $t_{RC}$. As a result, in the local precharge unit of each memory bank internally ensures that the write back timing requirement $t_{RAS}$ is fulfilled, rather than using an external controller to make sure that the write back requirement $t_{RAS}$ is fulfilled. As a result, the local precharge unit can thereby provide greater flexibility of command bus usage in comparison to the conventional precharge techniques shown in FIG. 4. Spacing between a bank activation command ACT and one of the precharge command PRE and the precharge all command PRE-ALL can thus comprise a variable number of clock cycles. In other words, spacing between one of the precharge command PRE and the precharge-all command PRE-ALL is adjustable with regard to bank activation command ACT such that the local precharge control unit can generate one of the precharge request PRE REQ and the precharge-all request PRE-ALL REQ at any time. Examples will now be discussed in greater detail with reference to FIGS. 12A and 12B.

Figure 2:
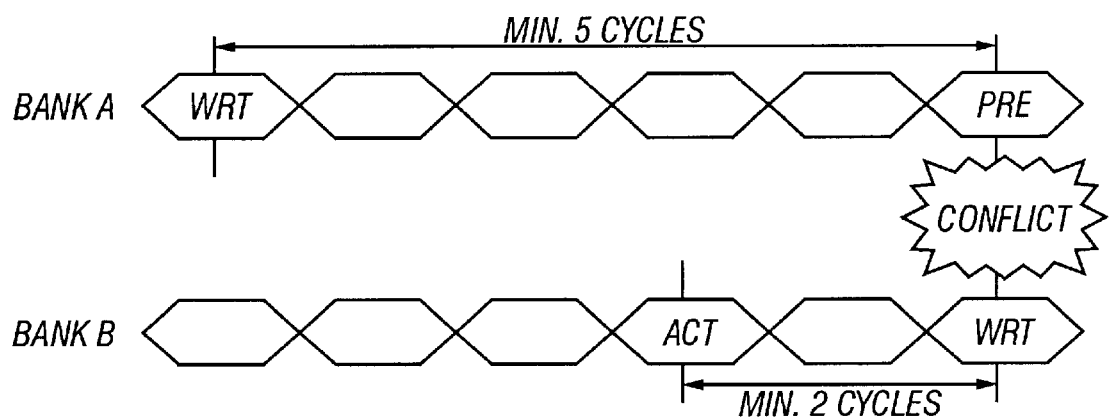
FIG. 2 is a timing diagram which further illustrates precharge command timing requirements for operation of a memory device according to the PC-100 Specification.
Figure 12A:
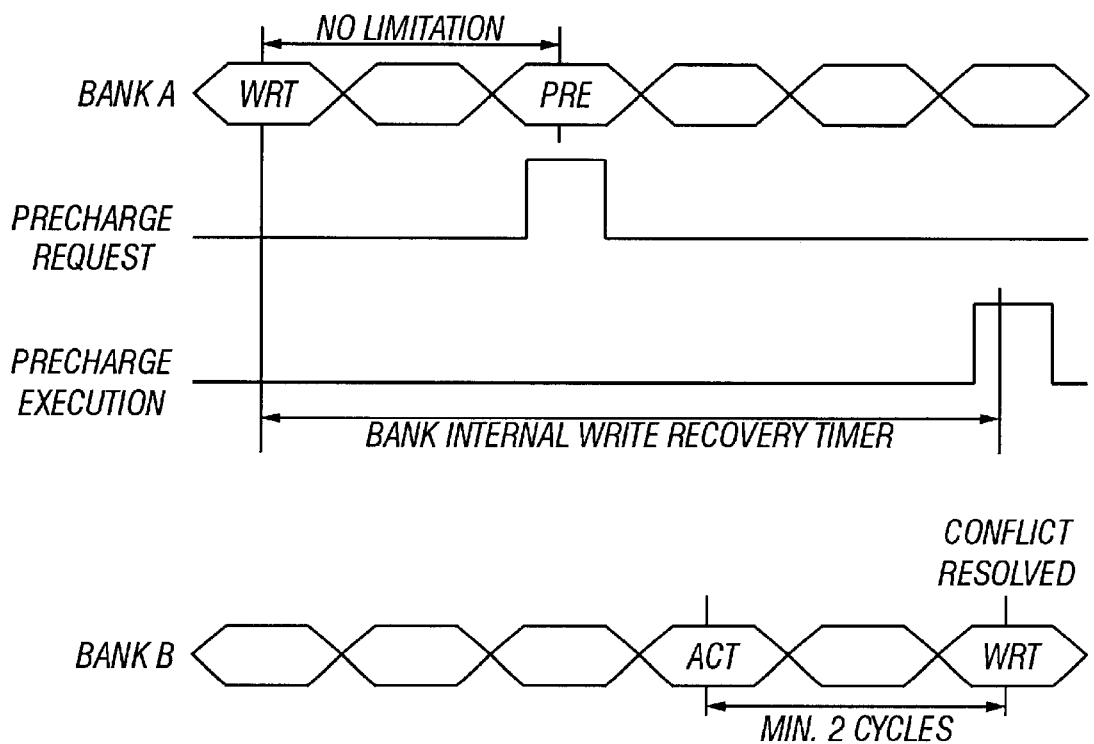
FIG. 12A is a timing diagram that illustrates precharge command timing requirements for operation of a memory device according to embodiments of the present invention.

Referring now to FIG. 12A, shown is a timing diagram that illustrates operation of embodiments of integrated circuit memory devices during a precharge command. As discussed above with respect to FIG. 2, potential conflicts on the command bus of a conventional DRAM device may occur due to write recovery restrictions that can preemptively restrict future usage of the command bus. The potential command bus conflict illustrated in FIG. 2 is resolved by the local precharge control unit since the posted precharge allows the external precharge command PRE to be generated at any time, without limitation, after the write command WRT.

Execution of the internally and locally posted precharge request PRE REQ can then be held back until a local write recovery timing requirement for that specific bank is satisfied. In other words, generation of the precharge request PRE REQ is not subject to a write recovery timing restriction. For example, as shown in FIG. 12A, the external precharge command is issued two cycles after the write command WRT and the precharge command PRE is sampled two cycles after the write command WRT to generate a precharge request PRE REQ. In this example, execution of the precharge request PRE REQ is held back internally for an additional three clock cycles to satisfy the write recovery requirement of five cycles. The added flexibility frees up the command bus, for example, for another write command WRT on Bank B without conflict with execution of the local precharge request PRE REQ on Bank A.

Thus, the local precharge control unit can also allow timing of the precharge command with respect to a write command to be adjustable since it is not subject to a write recovery timing limitation. As such, spacing between one of the precharge command PRE and the precharge-all command PRE-ALL and a write command WRT can be adjustable to provide variable spacing between the one of the precharge command PRE and the precharge-all command PRE-ALL and the write command WRT.

Figure 3:
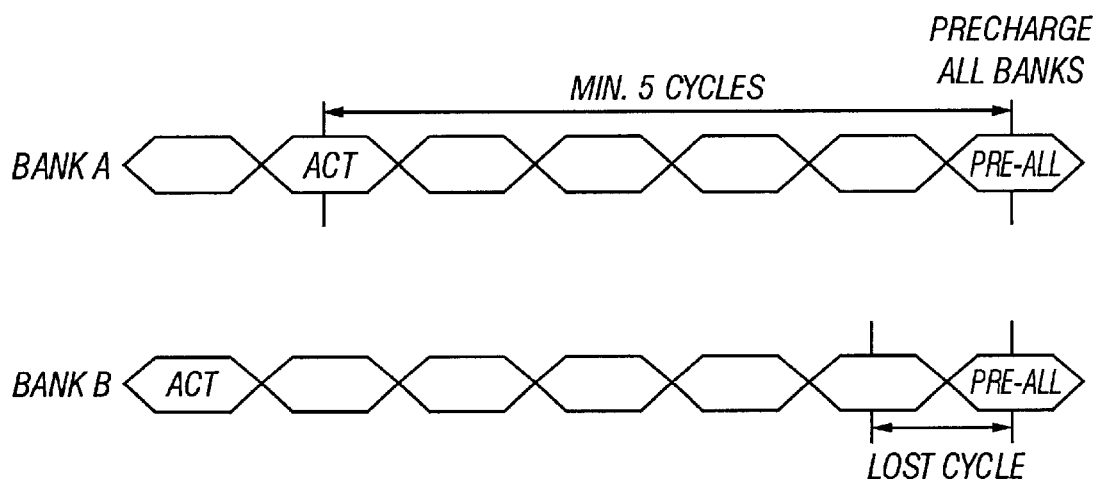
FIG. 3 is a timing diagram which illustrates precharge-all command timing requirements for operation of a memory device according to the PC-100 Specification.
Figure 12B:
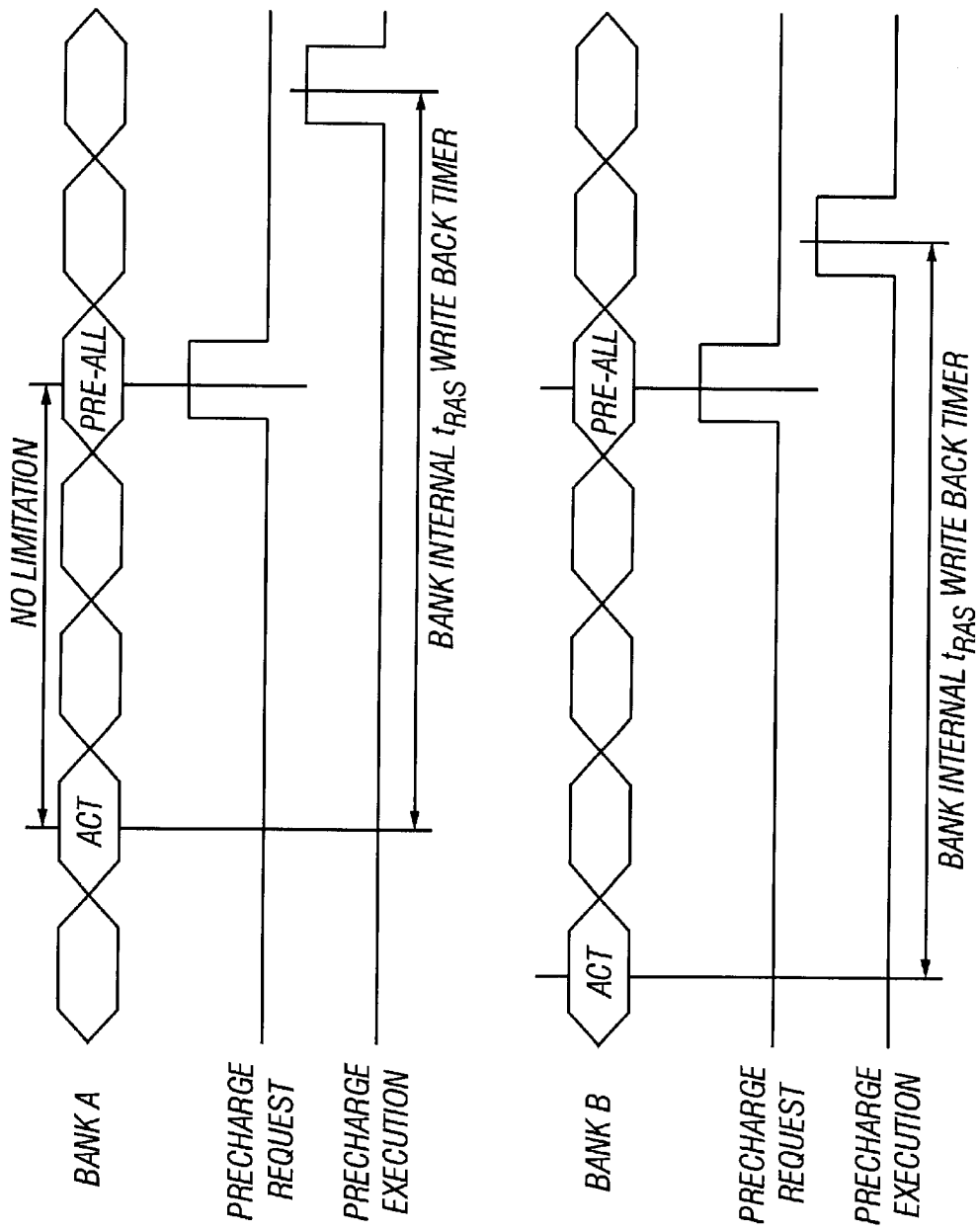
FIG. 12B is a timing diagram that illustrates precharge-all command timing requirements for operation of a memory device according to embodiments of the present invention.

Referring now to FIG. 12B, shown is a timing diagram which illustrates multiple command sequence timing options for operation of an integrated circuit memory device according to embodiments of the present invention. As discussed above with respect to FIG. 3, in conventional precharge techniques, fixed execution of the precharge-all command PRE-ALL can also limit usage of memory banks that have been activated at an earlier time as clock cycles may be lost because the precharge-all command PRE-ALL must be executed simultaneously on all banks.

As shown in FIG. 12B, the timing control of each local precharge control unit (for each bank) is local and can therefore solve the problem of lost clock cycles. This is because the precharge request PRE REQ can be generated at any time without a write back timing limitation. Once the external precharge-all command PRE-ALL is received for all memory banks, each of the active banks executes a local precharge bank command PRECHARGE as soon as the write back timing conditions are met for that specific bank. Spacing between the precharge-all command PRE-ALL and a bank activation command ACT is adjustable to provide variable spacing therebetween. This can contribute to improved system performance. By contrast, execution of the local precharge request PREREQ may be fixed with respect to the bank activation command ACT of the respective bank.

As a result, the local precharge control unit can allow the local precharge request PRE REQ to be generated at any time after an external precharge-all command PRE-ALL is received. As such, the local precharge bank request PRE-REQ may be executed without timing restrictions with respect to the external precharge-all command PRE-ALL. The precharge request PRE REQ can also be generated at any time after a bank activation command ACT without a write back timing limitation with respect to the external precharge-all command PRE-ALL.

In the example illustrated in FIG. 12B, an external precharge-all command PRE-ALL is issued three cycles after the bank activation command ACT to Bank A. The external precharge-all command PRE-ALL is issued without a write back timing limitation with respect to the bank activation command ACT at Bank A. Thereafter, the execution of the local precharge request PRE REQ to Bank A is held back for two cycles to fulfill the write back timing requirement $t_{RAS}$ of five cycles. Bank B executes the local precharge request PRE REQ (and generates the local precharge command PRECHARGE) one clock cycle earlier, since the bank activation command ACT to Bank B has been executed one clock cycle earlier than at Bank A. As a result, Bank B can be used for another bank activation command ACT one cycle earlier than Bank A, despite having the same external precharge-all command PRE-ALL.

As noted above, in conventional DRAM devices, the precharge-all command PRE-ALL can cause a high peak power consumption since during this command, all of the active word lines are shut off at the same time, and all of the bit line precharging circuits are turned on at the same time. However, as shown in FIG. 12B, the precharge-all command to Bank A is executed one clock cycle after the precharge-all command to Bank B. Thus, all of the active word lines are not necessarily shut off at the same time, and all of the bit line precharging circuits are not necessarily turned on at the same time. By executing the precharge-all command in a staggered fashion, such that all active banks are not precharged at the same time, the number of power consumption peaks may be reduced.

Figure 13A:
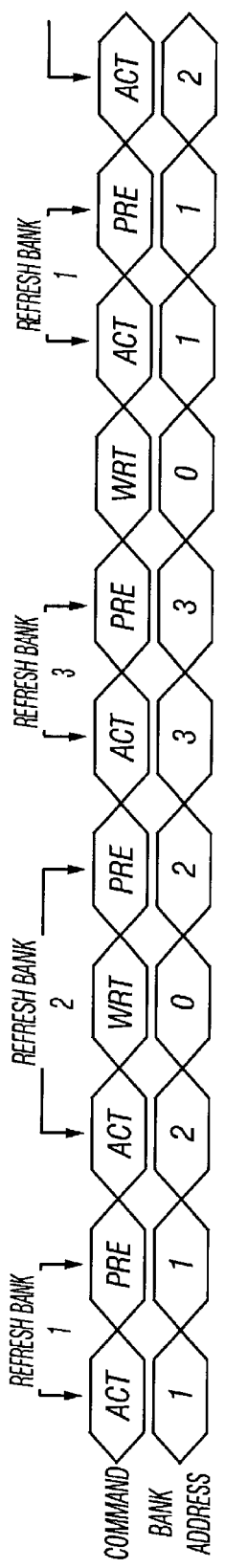
FIGS. 13A–13C are a series of timing diagrams comparing the posted precharge of the present invention with interleave refresh and sequential refresh according to the PC-100 Specification, respectively.
Figure 13B:
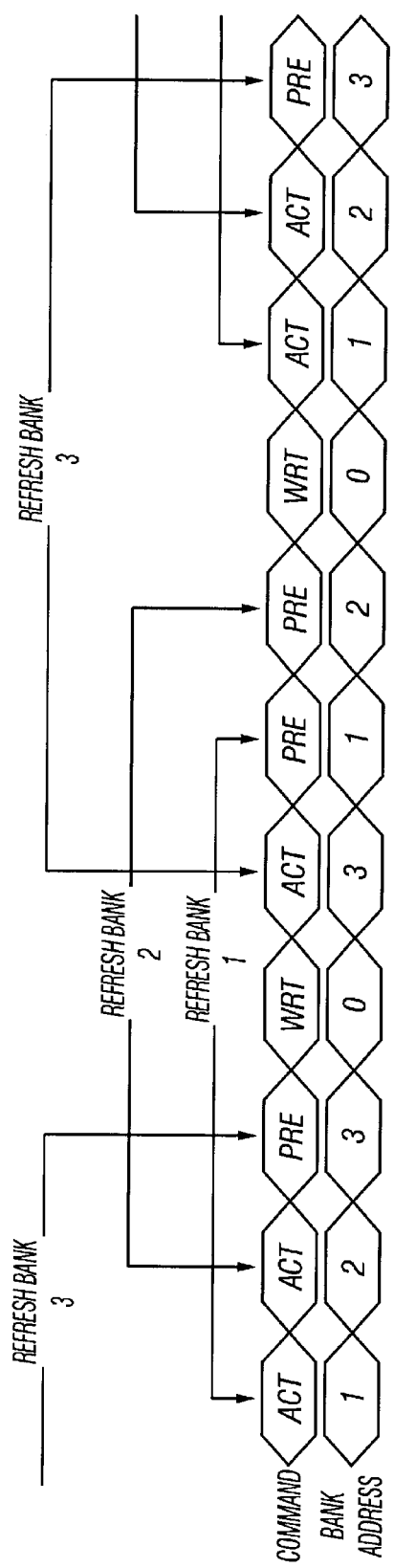
Figure 13C:
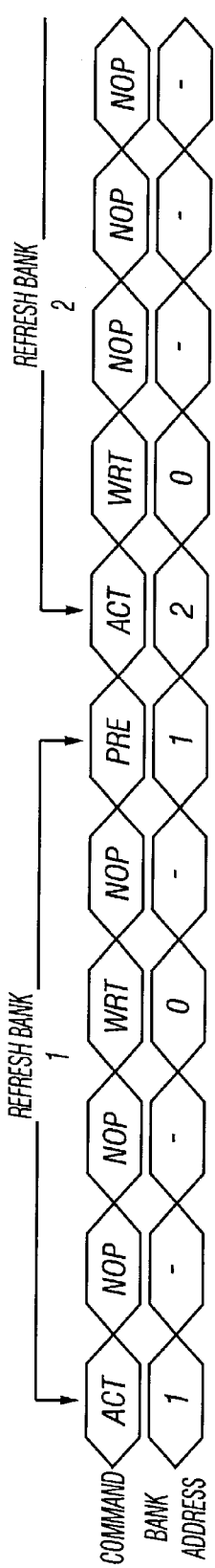

Referring now to FIG. 13A, shown is one in a series of timing diagrams comparing the posted precharge used in embodiments of the present invention with interleave refresh (FIG. 13B) and sequential refresh (FIG. 13C) according to the PC-100 Specification. FIG. 13A illustrates an example when an integrated circuit memory device having four independent memory banks has a seamless four bit burst write operation made to Bank 0 and a refresh operation performed on the remaining three banks. Here, each refresh operation consists of two commands, an activate command ACT followed by a precharge command PRE. As shown, the local precharge control unit can keep the respective activate-precharge cycles together for each bank to thereby simplify the usage of the memory device. By contrast, as shown in FIG. 13B, the PC-100 specification would require a very complex, bank-interleaved pattern for maximum performance. External controllers may not be capable of handling such complex, bank-interleaved patterns, because the memory controller would need to provide and handle a command pipeline for each of the memory banks. Accordingly, these pipelines would then have to be operated simultaneously, as indicated by the overlapping refresh cycles in FIG. 13B. Therefore, it may be necessary to utilize additional NOP (i.e., No OPeration) commands, as shown in FIG. 13C. FIG. 13C shows a non-interleaving version of the PC-100 specification with NOP commands that can also degrade the overall system performance. As can be seen in FIGS. 13B and 13C, bank refresh patterns are greatly extended in comparison to the bank refresh patterns in FIG. 13A. Thus, when comparing FIG. 13A to FIG. 13C, it will be appreciated that aspects of the present invention can have the potential to increase the operation speed of a memory device by a factor of 2 to 3.

Operation of a local precharge control unit will now be described.

Figure 14A:
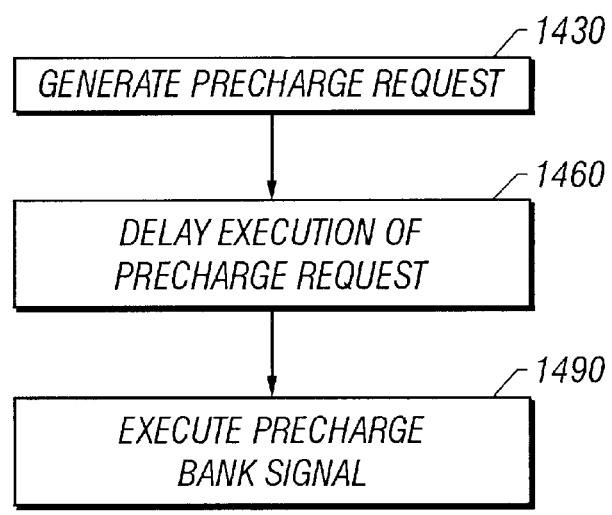
FIG. 14A is a flowchart that illustrates operations of the local precharge control unit according to embodiments of the present invention.

As shown in FIG. 14A, a local precharge unit can begin operation at Block 1430 where a precharge request is generated. At Block 1460, execution of the precharge request is delayed until a specified event. At Block 1490, a precharge bank signal is executed.

Figure 14B:
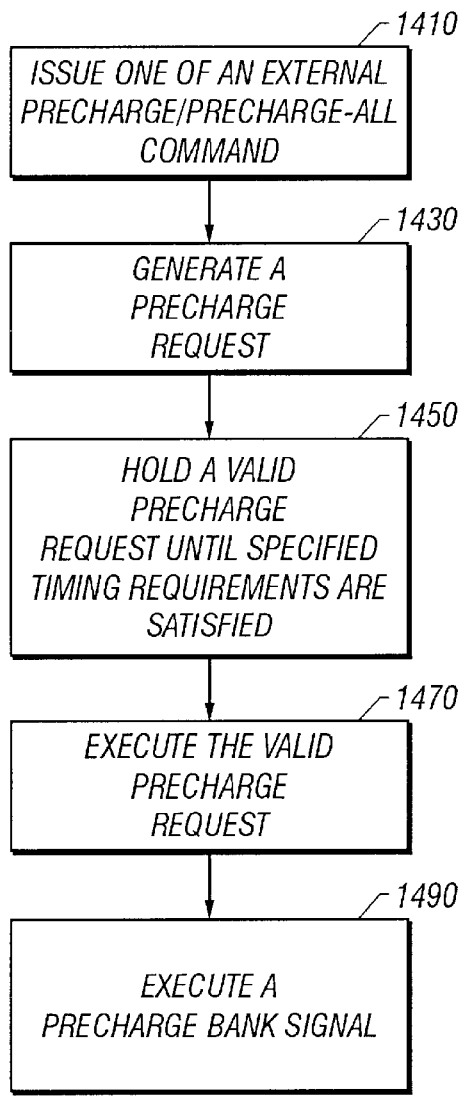
FIG. 14B is a flowchart that illustrates operation of a local precharge control unit according to other embodiments of the present invention.

FIG. 14B illustrates alternative operations of a local precharge unit. Referring now to FIG. 14B, shown is a flowchart that illustrates that at Block 1410, one of an external precharge command and an external precharge-all command is issued. At Block 1430, a precharge request is generated. At Block 1450, once it has been determined that the precharge request is valid, that request is held until specified timing requirements are satisfied. Then in Block 1470, a valid precharge request is executed. Finally, at Block 1490, a local precharge bank command is executed.

Figure 15G:
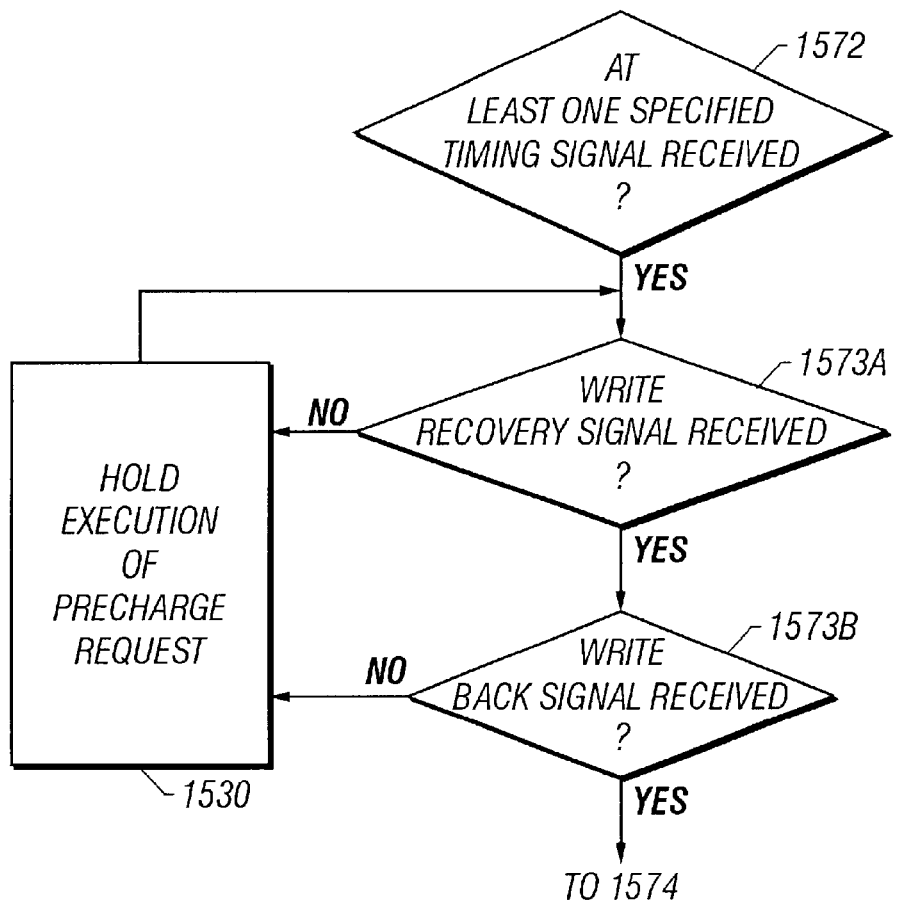
FIG. 15G is a flowchart illustrating exemplary operations of an aspect of the embodiments shown in FIG. 15F.
Figure 15A:
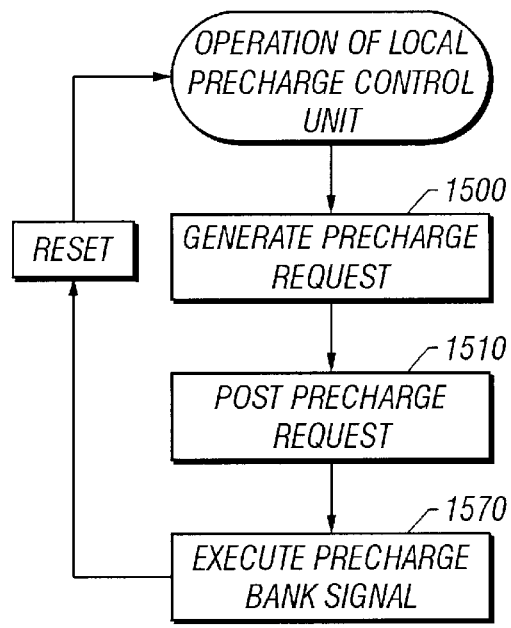
FIG. 15A is a flowchart that illustrates operation of a local precharge control unit according to other embodiments of the present invention.

Referring now to FIG. 15A at Block 1500, a precharge request is generated. At Block 1510, the precharge request is posted. At Block 1570, the local precharge bank command is generated. At Block 1511, once the local precharge command is executed, the local precharge control unit is reset. The technique for generating the precharge request will now be described in conjunction with FIG. 15B in greater detail.

Figure 15B:
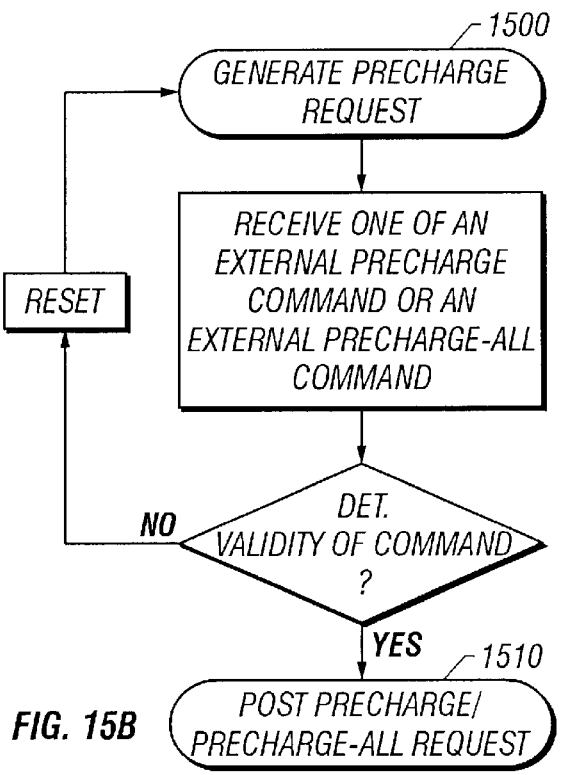
FIG. 15B is a flowchart illustrating exemplary operations of an aspect of the embodiments shown in FIG. 15A.

Referring now to FIG. 15B, shown is a flowchart illustrating exemplary operations of aspects of the embodiments shown in Block 1500 of FIG. 15A. In Block 1502, one of an external precharge command and an external precharge-all command is received. Then at Block 1504, a determination is made whether the command that is received at Block 1502 is valid. If the command received at Block 1504 is not valid, then at Block 1506, the process is reset. If the command received at Block 1504 is valid, then at Block 1510, the precharge request is posted, as will be described in greater detail below in conjunction with the description of FIG. 15C.

Figure 15C:
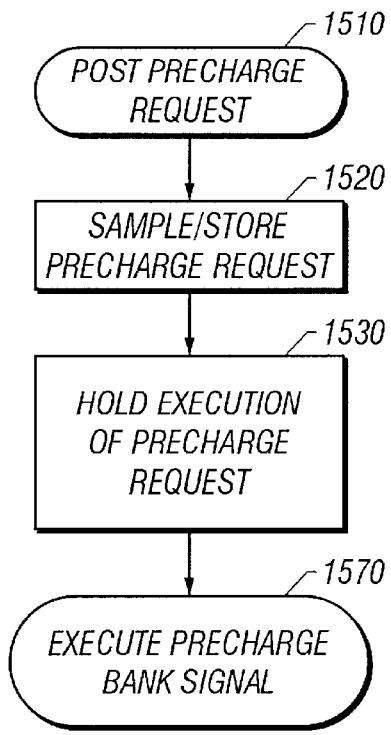
FIG. 15C is a flowchart illustrating exemplary operations of an aspect of the embodiments shown in FIG. 15A.

Referring now to FIG. 15C, shown is a flowchart illustrating exemplary operations of other aspects of the embodiments shown in Block 1510 of FIG. 15A. In particular, FIG. 15C shows methods of posting a precharge request. At Block 1520, the precharge request is sampled and then stored. Then at Block 1530, execution of the precharge request is held until at least one specified timing requirement is met. Once the at least one specified timing requirement is met, then the precharge request is executed to produce a local precharge bank command. One example of the sample and store operation at Block 1520 will now be described below in conjunction with FIG. 15D.

Figure 15D:
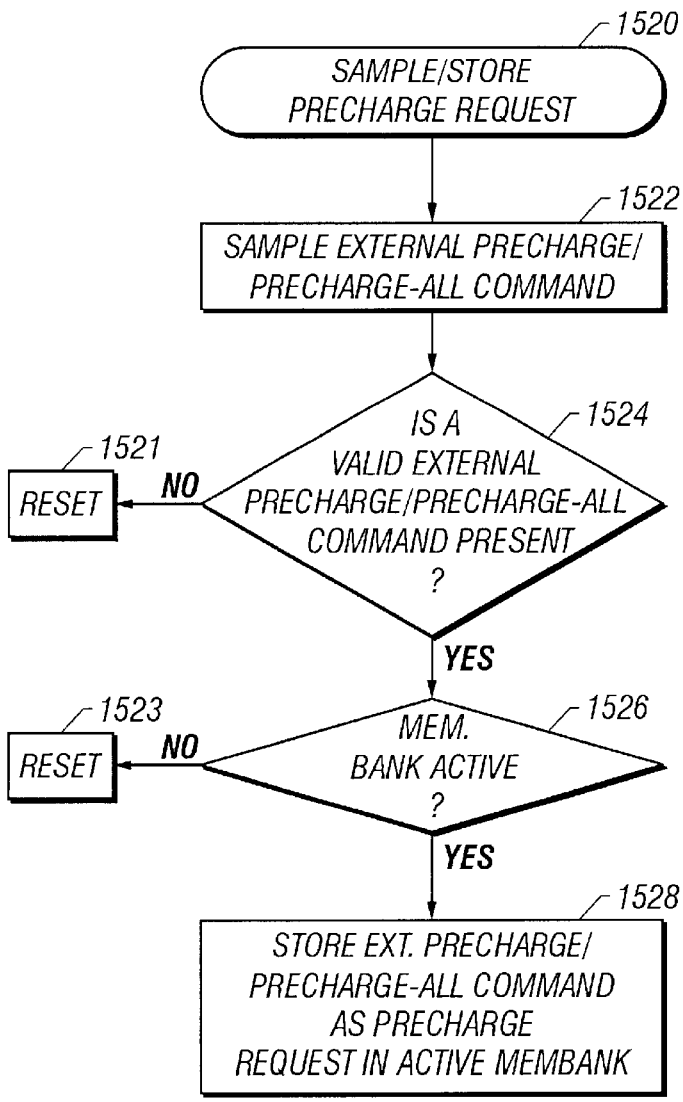
FIG. 15D is a flowchart illustrating exemplary operations of an aspect of the embodiments shown in FIG. 15C.

Referring now to FIG. 15D, shown is a flowchart illustrating exemplary operations of other aspects of the embodiments shown in Block 1520 of FIG. 15C. At Block 1522, the external precharge or precharge-all command is sampled. Then at Block 1524, a determination is made whether a valid external precharge or precharge-all command is present. If a valid command is not present, then at Block 1521, the precharge is reset and the process repeats itself. When a valid external precharge or precharge-all command is present at Block 1524, then at Block 1526 a determination is made whether the memory bank is active. If the memory bank is inactive, then the precharge routine resets itself at Block 1523. However, if the memory bank is active, then at Block 1528, the external precharge command or precharge-all command is stored as a precharge request in the active memory bank. To determine whether a valid external precharge command or valid external precharge-all command is present at Block 1524, an example will be discussed below in conjunction with FIG. 15E.

Figure 15E:
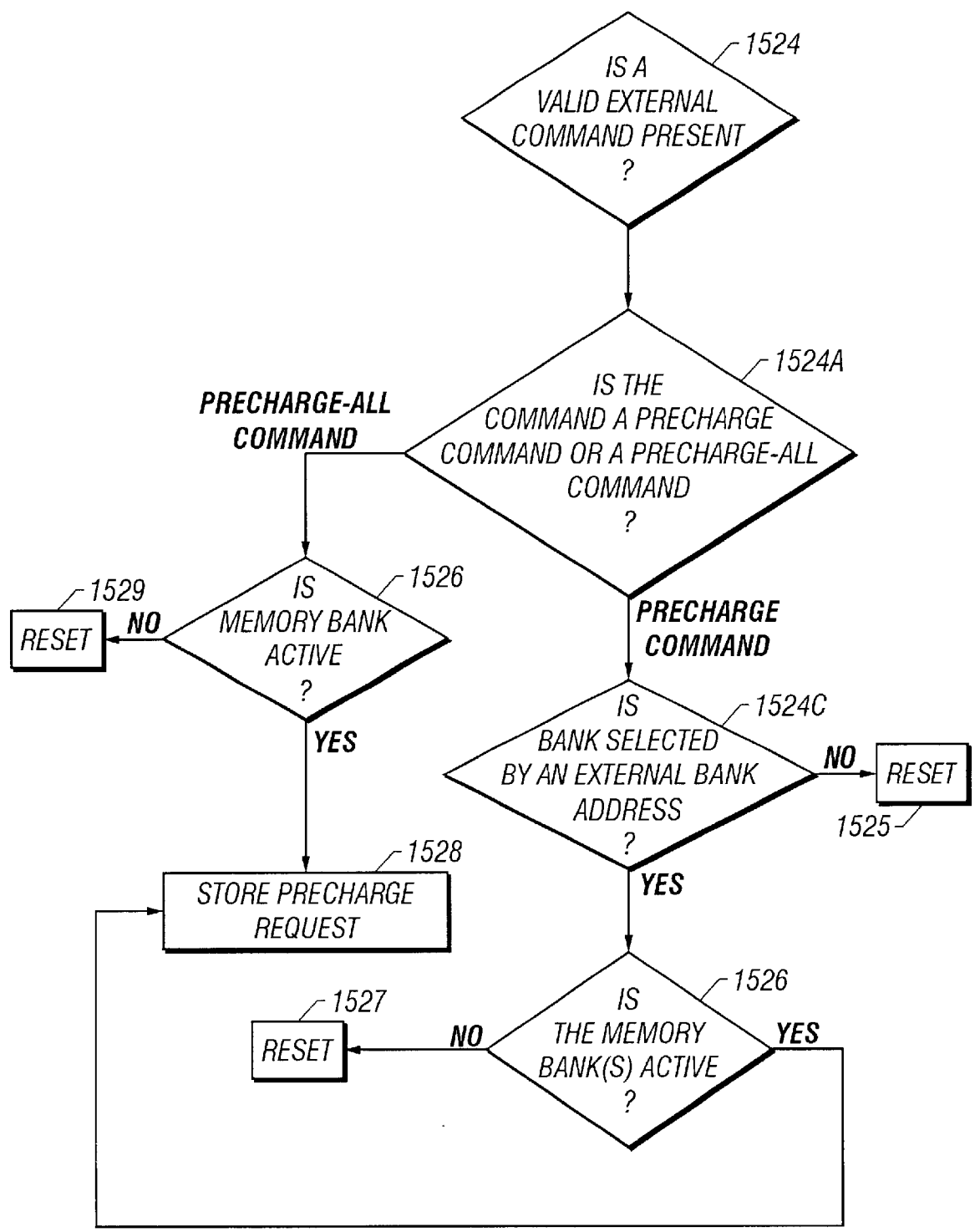
FIG. 15E is a flowchart illustrating the exemplary operations of an aspect of the embodiments shown in FIG. 15D.

Referring now to FIG. 15E, shown is a flowchart illustrating the exemplary operations of still other aspects of the embodiments shown in Block 1524 of FIG. 15D. At Block 1524A, a determination is made whether the command is a precharge command or a precharge-all command. If the command is a precharge-all command, then at Block 1526, a determination is made whether the memory bank is active. If the memory bank is active, then at Block 1528, the precharge request is stored. If the memory bank is not active, then at Block 1529, the local precharge control unit is reset. If at Block 1524A it is determined that a precharge command is present, then at Block 1524C, a determination is made whether the bank is selected by an external bank address. If the bank is selected by an external bank address, at Block 1526 a determination is made as to whether or not the memory bank is active. If the memory bank is active, then at Block 1528, the precharge request is stored. If at Block 1526 the memory bank it is determined that the bank is inactive, then the system is reset at Block 1527. At Block 1524, if a determination is made that the bank is not selected by the external bank address, then the precharge routine is reset at Block 1525.

Figure 15F:
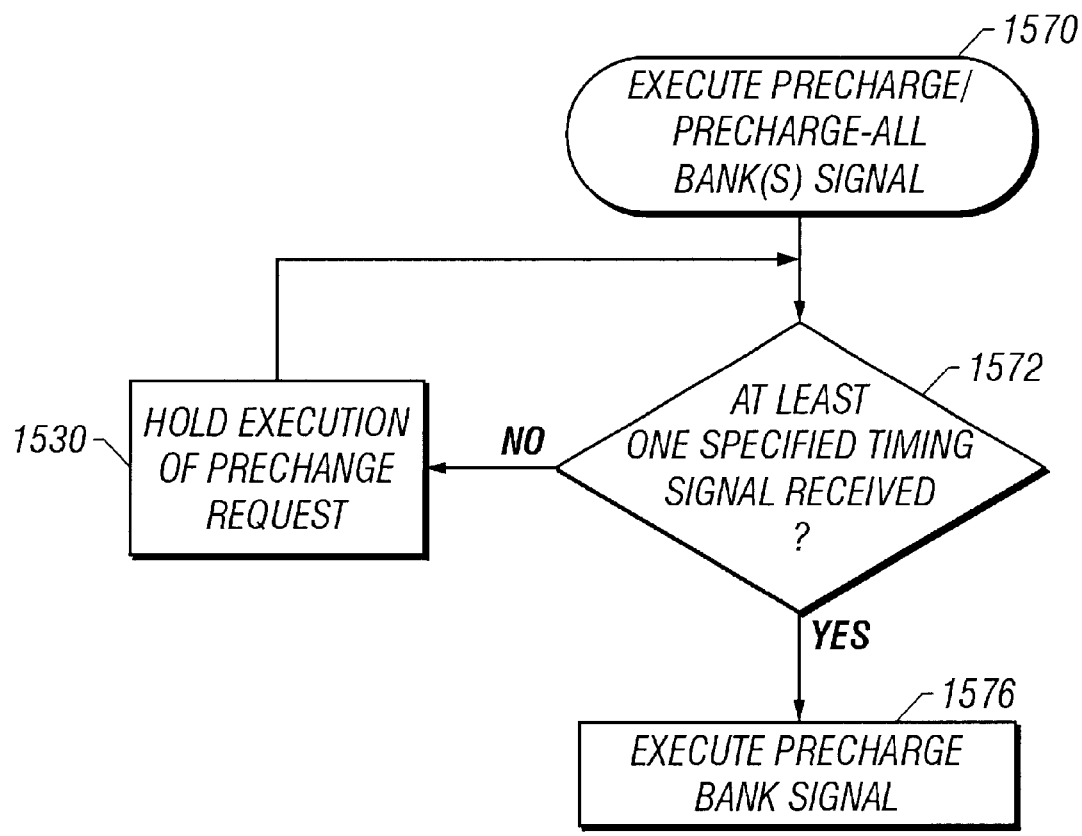
FIG. 15F is a flowchart illustrating exemplary operations of an aspect of the embodiments shown in FIG. 15A.

Referring now to FIG. 15F, shown is a flowchart illustrating exemplary operations of other aspects of the embodiments shown in Block 1570 of FIG. 15A. At Block 1572, a determination is made whether or not at least one specified timing signal is received. The determination here is similar to that discussed above with respect to the specified timing signal. If the at least one specified timing signal is received at Block 1572, then at Block 1576, the local precharge bank command will be executed. If at Block 1572 it is determined that the at least one specified timing signal has not been received, then at Block 1530, execution of the precharge request is held until the at least one specified timing signal is received at Block 1572.

Referring now to FIG. 15G, shown is a flowchart illustrating exemplary operations of other aspects of the embodiments shown in Block 1572 of FIG. 15F. In determining whether or not at least one specified timing signal has been received at Block 1572, it can first be determined whether or not a write recovery signal has been received at Block 1573A. If the write recovery signal has not been received at Block 1573A, then execution of the precharge request or precharge-all request is held at Block 1530. However, if the write recovery signal has been received at Block 1573A, then at Block 1573B, a determination can be made whether or not a write back signal has been received. If the write back signal has been received at Block 1573B, then the routine proceeds to Block 1576 of FIG. 15F. In the event the write back signal is not received at Block 1573B, then execution of the precharge request or precharge-all request is held at Block 1530.

Accordingly, a precharge command can be issued to a single bank or a precharge-all command can be issued to all banks of an integrated circuit memory device (e.g., DRAM circuit) at any time during normal operation of the device. Internal circuits are provided to decode the respective commands and send the precharge command(s) to the different independent memory banks of the integrated circuit memory device (e.g., DRAM circuit). A local precharge control unit (or circuit) is present inside each of the memory banks that can receive and process the decoded precharge commands. If certain specified timing conditions are met, the local precharge control unit can issue and store a precharge request for a specific bank. The specified timing conditions can be controlled by timer circuits (e.g., delay lines). The precharge request can be held back until all timing requirements are fulfilled. The precharge request can then be automatically executed.

In comparison to a conventional DRAM integrated circuit device, the aspects of the present invention that are described-above can provide improved system performance. By removing timing restrictions that are normally present during execution of one of the precharge command and the precharge-all command, more flexible command bus utilization can be provided. Data bus utilization can also be improved since more opportunities are generated to issue read or write commands for the data bus. Finally, the number of power consumption peaks can also be reduced. These improvements with respect to command bus and data bus utilization can lead to overall improvements in system performance.

In the drawings and specification, there have been disclosed typical embodiments of the invention and, although specific terms are employed, they are used in a generic and descriptive sense only and not for purposes of limitation. The broad principles of the invention have been described above, and numerous ways in which the invention can be adapted have been pointed out. All such variations are considered to fall within the scope and spirit of the invention as described by the following claims.

For example, in the embodiments discussed above, the local precharge control units include means for posting. However, the means for posting could also cover means for delaying execution of one of the precharge request and the precharge-all request until an indication is provided that the at least one specified timing requirement has been satisfied for at least that memory bank. In addition, the specification also describes that the at least one specified timing requirement can comprise a write back timing requirement and a write recovery timing requirement. However, other specified timing requirements could also be used to initiate execution of the precharge request or precharge-all request as long as satisfactory write back and satisfactory write recovery are allowed within each memory bank. For example, other implementations can combine the timing requirements with other externally applied or internally generated commands. Inside the memory bank, the write recovery timer signal might be combined with a signal indicating an interrupt of a write operation in order to modify the behavior of the local precharge control unit with respect to interrupt commands. Furthermore, as will be appreciated by those skilled in the art of electronic circuit design, the embodiments describing the implementation of the local precharge control unit are of exemplary nature. For example, the storing means 1041 illustrated as being constructed of two cross coupled inverters can have various different implementations, such as implementations employing D-Flip-Flops which are mainly constructed using NAND gates.

What is claimed is:

1. An electronic memory apparatus, comprising:
   a prechargeable memory array;
   a command bus for receiving an input precharge command;
   a logic portion coupled between said command bus and said memory array for isolating said memory array from the input precharge command, said logic portion having an input for receiving information indicative of satisfaction of a timing constraint associated with execution of a precharge operation on said memory array, said logic portion responsive to the input precharge command for confirming satisfaction of said timing constraint and thereafter applying an output precharge command to said memory array; and
   said memory array responsive to said output precharge command for executing said precharge operation.

2. The apparatus of claim 1, wherein said logic portion includes a validity input for receiving information indicative of whether the input precharge command is valid, said logic portion responsive to said validity information for applying the output precharge command to said memory array only if said validity information indicates that the input precharge command is valid.

3. The apparatus of claim 2, including a memory array structure having a plurality of banks, wherein said memory array is one of said banks, wherein the input precharge command is associated with said one bank, and wherein said validity information includes information indicative of whether said one bank is active.

4. The apparatus of claim 3, wherein said logic portion is for determining that the input precharge command is valid if said bank active information indicates that said one bank is active.

5. The apparatus of claim 4, wherein the input precharge command is a precharge-all command that commands precharging of said plurality of banks.

6. The apparatus of claim 3, wherein said validity information includes information indicative of whether said one bank is selected on said command bus, and including a bank decoder coupled between said command bus and said logic portion for providing said bank select information to said logic portion, and wherein said logic portion is for determining that the input precharge command is valid if said bank active information indicates that said one bank is active and said bank select information indicates that said one bank is selected.

7. The apparatus of claim 1, wherein said timing constraint is a write back constraint, and including a write back timer coupled to said logic portion for providing to said logic portion an indication that said write back constraint has been satisfied.

8. The apparatus of claim 1, wherein said timing constraint is a write recovery constraint, and including a write recovery timer coupled to said logic portion for providing to said logic portion an indication that said write recovery constraint has been satisfied.

9. The apparatus of claim 1, wherein said satisfaction information includes information indicative of satisfaction of both a write recovery timing constraint and a write back timing constraint, said logic portion for determining that said first-mentioned timing constraint has been satisfied if said write recovery timing constraint and said write back timing constraint are both satisfied.

10. The apparatus of claim 1, including a memory array structure having a plurality of banks, wherein said memory array is one of said banks.

11. The apparatus of claim 10, wherein the input precharge command is a precharge-all command that commands precharging of said plurality of banks.

12. The apparatus of claim 10, including a plurality of said logic portions coupled between said command bus and respective ones of said banks.

13. The apparatus of claim 1, wherein said memory array is a synchronous DRAM array.

14. A method of precharging an electronic memory array, comprising:

receiving an input precharge command;

isolating the memory array from the input precharge command; and in response to said input precharge command, confirming satisfaction of a timing constraint associated with execution of a precharge operation on the memory array, and thereafter executing the precharge operation on the memory array.

15. The method of claim 14, including determining whether the input precharge command is valid, and performing said executing step only if the input precharge command is determined to be valid.

16. The method of claim 15, wherein the memory array is one of a plurality of banks within a memory array structure, wherein the input precharge command is associated with said one bank, and wherein said determining step includes determining whether said one bank is active.

17. The method of claim 16, wherein said first-mentioned determining step includes considering the input precharge command to be valid if said one bank is active.

18. The method of claim 17, wherein the input precharge command is a precharge-all command that commands precharging of said plurality of banks.

19. The method of claim 16, wherein said first-mentioned determining step includes determining whether said one bank is selected and considering the input precharge command to be valid paid one bank is active and selected.

20. The method of claim 14, wherein said timing constraint is a write back constraint.

21. The method of claim 14, wherein said timing constraint is a write recovery constraint.

22. The method of claim 14, wherein said confirming step includes determining that both a write recovery timing constraint and a write back timing constraint have been satisfied.

23. The method of claim 14, wherein the memory array is one of a plurality of banks within a memory array structure, and wherein the input precharge command is a precharge-all command that commands precharging of said plurality of banks.

24. The method of claim 23, wherein said executing step includes precharging a first of said banks at a first point in time and precharging a second of said banks at a second point in time that is timewise separated from said first point.

25. The method of claim 24, including, in response to the precharge-all command, waiting for a first length of time and then performing said step of precharging said first bank and waiting for a second length of time and then performing said step of precharging said second bank, wherein said second length of time differs from said first length of time.

26. The method of claim 14, wherein the memory array is one of a plurality of banks within a memory array structure, and wherein the input precharge command is associated with said one bank, and including providing the input precharge command such that said step of receiving the input precharge command occurs at any selected one of a plurality of possible of points in time after a most recent receipt of one of a read command, a write command and an activate command associated with said one bank.

* * * * *